United States Patent
Yano et al.

(10) Patent No.: US 9,643,894 B2
(45) Date of Patent: May 9, 2017

(54) HIGH SURFACE AREA CARBON OPALS AND INVERSE OPALS OBTAINED THEREFROM

(75) Inventors: Kazuhisa Yano, Ann Arbor, MI (US); Matthew Dave Goodman, Urbana, IL (US); Paul Vannest Braun, Savoy, IL (US)

(73) Assignees: Toyota Motor Engineering & Manufacturing North America, Inc., Erlanger, KY (US); The Board of Trustees Of The University Of Illinois, Urbana, IL (US)

( * ) Notice: Subject to any disclaimer, the term of this patent is extended or adjusted under 35 U.S.C. 154(b) by 830 days.

(21) Appl. No.: 13/526,395

(22) Filed: Jun. 18, 2012

(65) Prior Publication Data

US 2013/0337257 A1     Dec. 19, 2013

(51) Int. Cl.
    *B32B 5/16*     (2006.01)
    *C04B 38/06*     (2006.01)
    (Continued)

(52) U.S. Cl.
CPC ........... *C04B 38/0615* (2013.01); *B01J 21/18* (2013.01); *B01J 32/00* (2013.01); *B32B 5/16* (2013.01); *B32B 5/18* (2013.01); *B32B 9/00* (2013.01); *B82B 1/001* (2013.01); *B82B 3/0033* (2013.01); *B82Y 30/00* (2013.01); *C01B 31/00* (2013.01); *C04B 35/528* (2013.01); *C04B 38/0041* (2013.01); *C23C 14/046* (2013.01); *C23C 14/083* (2013.01); *B01J 35/0013* (2013.01); *B01J 35/0033* (2013.01); *B01J 35/1023* (2013.01); *B01J 35/1028* (2013.01); *B01J 35/1038* (2013.01); *B01J 35/1042* (2013.01);
(Continued)

(58) Field of Classification Search
CPC .. C01B 31/02; C01B 31/0293; Y10S 977/847
USPC .......................... 428/402, 403; 977/745, 748
See application file for complete search history.

(56) References Cited

U.S. PATENT DOCUMENTS 5,990,041 A  * 11/1999 Chung .................. C01B 31/089
                                                               423/447.6
6,517,763 B1     2/2003 Zakhidov et al.
(Continued)

OTHER PUBLICATIONS

Sun et al, Colloidal carbon spheres and their core/shell structures with noble-metal nanoparticles, Angew. Chem. Inter. Edit., vol. 43, (2004) pp. 597-601.*
(Continued)

*Primary Examiner* — Holly Le
(74) *Attorney, Agent, or Firm* — Christopher G. Darrow; Darrow Mustafa PC

(57) ABSTRACT

A self-assembled carbon structure such as a carbon opal is disclosed herein. The structure is composed of hydrophilic carbon spheres oriented in a periodic colloidal crystal structure, wherein the carbon spheres have a porous surface, wherein the carbons spheres have an average particle diameter less than 3000 nm. Also disclosed is an inverse opal structure that includes a plurality of voids in the structural material. The voids are regularly arranged in an ordered periodic structure, the voids having a spherical shape. The inverse opal structure has a specific surface area greater than 100 m²/g and method for making the same together with materials that employ the same.

23 Claims, 22 Drawing Sheets

(51) Int. Cl.

| | | |
|---|---|---|
| B01J 32/00 | (2006.01) | |
| B32B 5/18 | (2006.01) | |
| B32B 9/00 | (2006.01) | |
| B82Y 30/00 | (2011.01) | |
| C23C 14/04 | (2006.01) | |
| C23C 14/08 | (2006.01) | |
| C04B 35/528 | (2006.01) | |
| C04B 38/00 | (2006.01) | |
| B01J 21/18 | (2006.01) | |
| C01B 31/00 | (2006.01) | |
| B82B 1/00 | (2006.01) | |
| B82B 3/00 | (2006.01) | |
| B01J 35/00 | (2006.01) | |
| B01J 35/10 | (2006.01) | |

(52) U.S. Cl.
CPC ........ *B01J 35/1047* (2013.01); *B01J 35/1057* (2013.01); *B01J 35/1061* (2013.01); *C01P 2006/12* (2013.01); *C01P 2006/14* (2013.01); *C01P 2006/16* (2013.01); *C04B 2235/3244* (2013.01); *C04B 2235/5445* (2013.01); *C04B 2235/614* (2013.01); *C04B 2235/785* (2013.01); *Y10T 428/249953* (2015.04); *Y10T 428/2918* (2015.01); *Y10T 428/2982* (2015.01); *Y10T 428/2991* (2015.01)

(56) References Cited

U.S. PATENT DOCUMENTS

| | | |
|---|---|---|
| 2001/0019037 A1 | 9/2001 | Zakhidov et al. |
| 2004/0118539 A1* | 6/2004 | Sundaram ............. D21H 23/08 162/158 |
| 2008/0233040 A1 | 9/2008 | Barron et al. |
| 2009/0200561 A1 | 8/2009 | Burrell et al. |
| 2010/0069567 A1* | 3/2010 | Petrov ................... B82Y 30/00 524/560 |

OTHER PUBLICATIONS

Wendy Chan, Formation of Colloidal Crystals from Nanoparticle Stabilized Colloidal Suspensions, Thesis 2005.*

Denny, Nicholas R., et al.; Effects of Thermal Process on the Structure of Monolithic Tungsten and Tungsten Alloy Photonic Crystals; Chem. Mater., (2007), vol. 19, No. 18, pp. 4563-4569.

Jia, Fei, et al.; A Facile Approach to Fabricate Three-Dimensional Ordered Macroporous Rutile Titania At Low Calcination Temperature; J. Mater. Chem., (2012), vol. 22, pp. 2435-2441.

Kapitonov, A.M.; One-Dimensional Opal Photonic Crystals; Photonics and Nanostructures-Fundamentals and Applications, vol. 6 (2008), pp. 194-199.

Zhi, Linjie, et al.; From Well-Defined Carbon-Rich Precursors to Monodisperse Carbon Particles with Hierarchic Structures; Ad. Mater., (2007) vol. 19, pp. 1849-1853.

Perpall, Mark W., et al.; Novel Network Polymer for Templated Carbon Photonic Crystal Structures; Langmuir, (2003), vol. 19, pp. 7153-7156.

Zakhidov, Anvar A., et al.; CVD Synthesis of Carbon-Based Metallic Photonic Crystals; NanoStructured Materials, vol. 12, (1999), pp. 1089-1095.

Yamada, Yuri, et al.; Artificial Black Opal Fabricated From Nanoporous Carbon Spheres; Langmuir, (2010), vol. 26 (12), pp. 10044-10049.

Nakamura, Tadashi, et al.; Monodispersed Nanoporous Starburst Carbon Spheres and Their Three-Dimensionally Ordered Arrays; Microporous and Mesoporous Materials, vol. 117, (2009), pp. 478-485.

* cited by examiner

HIGH SURFACE AREA CARBON OPALS AND INVERSE OPALS OBTAINED THEREFROM

TECHNICAL FIELD

The present invention is directed to the field of high surface area opals and processes for the production of such material. The present invention is also directed to inverse opals obtained from processes that utilize high surface area carbon opals and processed for producing the same. The present invention also pertains to at least one product employing high surface area carbon opals and at least one product utilizing inverse opals that are produced from high surface area carbon opals.

BACKGROUND

Colloidal crystal arrays are valued for their optical properties, connected pore network, and ease of assembly. In various applications opals have been used as templates to produce material utilized in optoelectronic devices, sensing applications and energy storage in order to take advantage of the interconnected three-dimensional structure and/or strong optical properties. Generally, the opal platform has been limited to silica, poly(methyl methacrylate) or polystyrene colloids. These opals can be converted to other materials through templating processes, where materials are grown around the opal. When necessary, the process step is followed by opal removal. Various devices and applications benefit from the use of high-surface area structures that are derived from opal templates. These include but are not limited to solar cell anodes and the like.

Incorporation of carbon such as carbon black into polymer opals has resulted in brilliant colors due to suppression of back reflected scattered light. While carbon framework inverse opals have been fabricated, carbon opals have only been realized through chemical vapor deposition (CVD) on a sacrificial, mesoporous silica opal. CVD and related etching processes are complex and time consuming. While this process does create an opal structure, it would be desirable to provide a process that would accomplish self-assembly of carbon colloids in a manner that would eliminate the need for CVD and etching processes. Due to the high thermal stability of carbon (greater than 1000° C. in inert environment), a self-assembled carbon opal would be highly desirable for high-temperature inversion as well as for their inherent properties. High quality colloidal crystals require colloids that are monodispersed (defined herein as having a size variation less than about 5%) and that form a stable suspension. The production of such materials from carbon has been problematic.

It would be desirable to produce high quality colloids, particularly those that would be thermally stable and could permit development of additional fabrication techniques. It is also desirable to provide opals which could be removed via orthogonal processes relative to other materials, and thus provide the opportunity to template materials which otherwise cannot be templated. An orthogonal template material is one that can be removed in a manner or process that does not negatively interact with the inverse structure. It would also be desirable to produce high-surface area structures based on an opal platform as well as to produce materials based on the same.

SUMMARY

A self-assembled carbon structure is disclosed herein. The structure is composed of hydrophilic carbon spheres oriented in a periodic colloidal crystal structure. The carbon spheres have a porous surface and an average particle diameter less than 3000 nm.

Also disclosed herein is an inverse opal structure that includes a structural material selected from the group consisting of metal, chalcogenides, Group II-VI semiconductors, AlN, inorganic nitrides, and inorganic oxides with a plurality of voids in the structural material. The voids are regularly arranged in an ordered periodic structure, the voids having a spherical shape and an average diameter ranging from about 120 nm to 1400 nm. The inverse opal structure has a specific surface area greater than 100 $m^2/g$.

Also disclosed is a reflective structure for ultraviolet, visible or infrared wavelengths comprising a periodic ordered structure containing surfaces or interfaces that are inverse replicas of a sphere array wherein the sphere array was composed of hydrophilic monodispersed carbon spheres, wherein the spheres have an average surface area greater than 800 $m^2/g$ and an average pore size between 1.0 nm and 10.0 nm.

Further disclosed is a method for producing an inverse opal that includes the steps of orienting hydrophilic monodispersed porous carbon spheres in a ordered periodic structure, the hydrophilic monodispersed porous carbon spheres having a surface area greater than 500 $m^2/g$ and pores of a depth and size; depositing a material onto the surface of the hydrophilic monodispersed porous carbon spheres such that the coating material penetrates into the pores of the microsphere; and removing at least a portion of the carbon from contact with the deposited coating material.

BRIEF DESCRIPTION OF THE DRAWING

The various features, advantages and other uses of the present disclosure will become more apparent by referring to the following detailed description and drawings in which.

DETAILED DESCRIPTION

Figure 1:
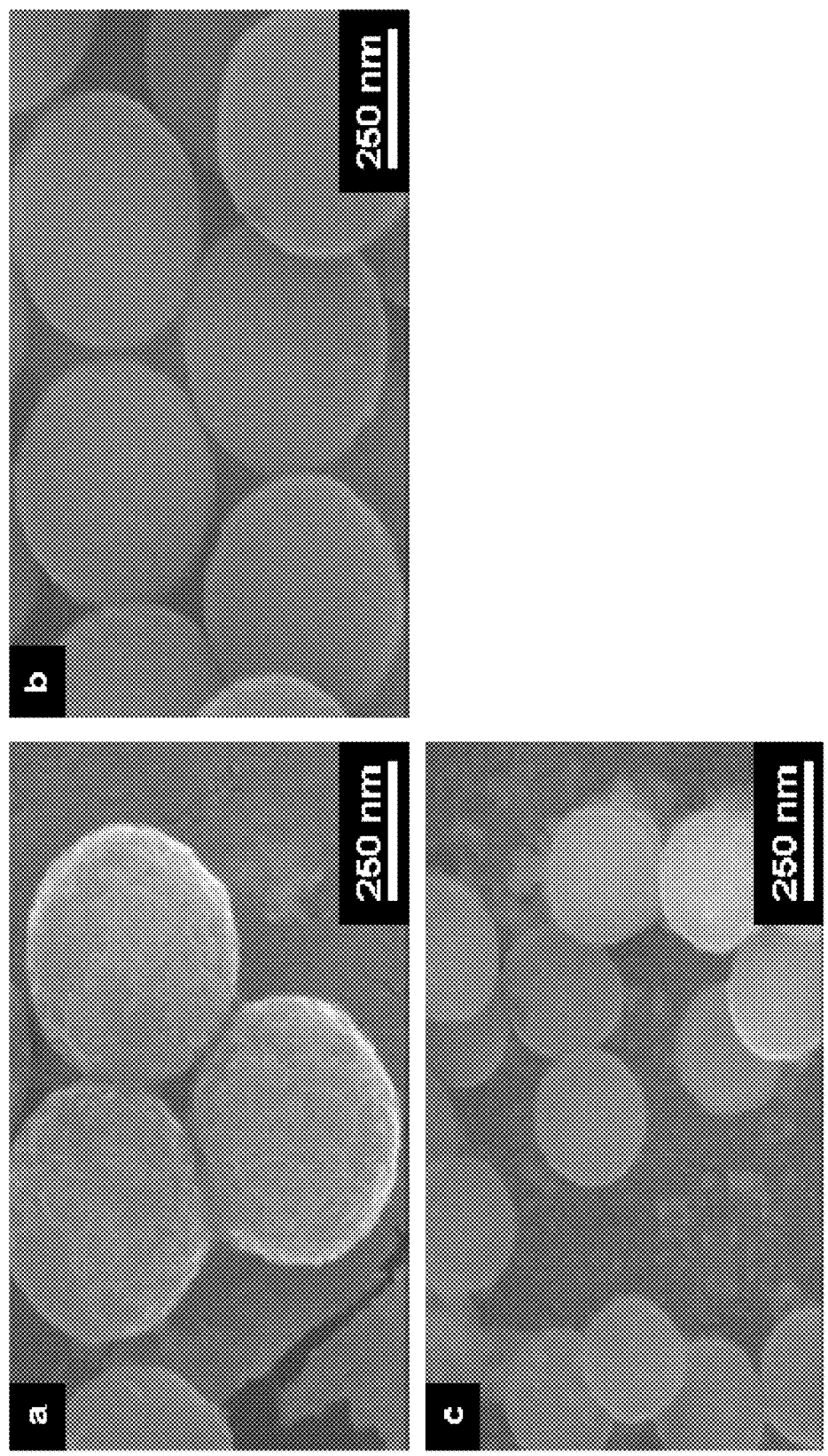
FIGS. 1A through 1C are SEM micrographs of monodispersed starburst carbon spheres (MSCS) oxidized for 30 minutes at 300° C., 400° C. and 500° C. respectively.

Disclosed herein are self-assembled carbon structures, and inverse opals obtained therefrom, together with methods for producing the same as well as highly ordered colloidal crystals composed of high surface area carbon material such as carbon opal material and crystal material composed of the inverse opals obtained from high surface area carbon opals that are used as a template.

In certain applications, the self-assembled carbon structure will include hydrophilic carbon spheres oriented in a periodic colloidal crystal structure in which the carbon spheres have an average particle diameter less than 3000 nm, an average pore size between 1.0 and 20 nm; and a deposition material deposited in the pores of the hydrophilic carbon spheres, the deposition material comprising at least one of metals, chalcogenides and inorganic oxides wherein the deposition product is present at a depth of at least 25% of the sphere.

The self-assembled carbon opal structure disclosed herein is composed of hydrophilic carbon spheres oriented in a periodic colloidal crystal structure, wherein the carbon spheres have a porous surface, wherein the carbons spheres have an average particle diameter less than 3000 nm, with an average particle size less than 1400 nm in certain embodiments. In various embodiments, the hydrophilic carbon spheres will have an average particle diameter between 120 nm and 1400 nm, with average particle diameters less than 800 nm employed in certain embodiments and less than 500 in other certain embodiments.

In various embodiments, the carbon spheres have an average pore size between 1.0 nm and 10.0 nm, with an average pore size less than 2.5 nm being present in certain specific embodiments and average pore sizes between 1.5 nm and 2.5 nm being present in certain instances. The hydrophilic carbon spheres employed in this disclosure are high surface area materials. The hydrophilic carbons spheres can have an average surface area greater than 500 $m^2/g$, with average surface areas greater than 1000 $m^2/g$ being employed in certain instances and hydrophilic carbon spheres having average surface areas greater than 1300 $m^2/g$ being employed in certain other embodiments.

The hydrophilic carbon spheres are oriented in a periodic colloidal structure in a generally ordered structure. In various embodiments, the hydrophilic carbon spheres are oriented in a periodic structure in at least two dimensions in the colloidal crystal. However in various applications, it is contemplated that the hydrophilic porous carbon spheres will be oriented in a three-dimensional, ordered periodic structure. Thus the colloidal crystalline structure can be composed of carbon spheres arrayed in a single layer if desired or required. It is also within the purview of this disclosure that the colloidal crystal be configured with two or more layers of hydrophilic carbon spheres; with structures having three or more layers being contemplated in this disclosure.

The term "three-dimensional periodic structure" as employed herein is defined to mean that the hydrophilic carbon spheres are positioned in ordered orientation relative to one another. The hydrophilic spheres can be positioned to define face centered orientation, a hexagonal cross packed orientation or both as desired or required.

The carbon spheres employed within the scope of this disclosure are hydrophilic. As employed herein this term is defined as exhibiting a tendency of the material to be attached to water. The carbon spheres employed in the present disclosure can be rendered hydrophilic by functionalization; i.e. the introduction and incorporation of oxygen moieties onto the surface of the spheres as by exposure to oxygen-donating compounds such as $H_2SO_4$, $H_2O_2$ or the like. It is also contemplated that the carbon spheres can be functionalized by exposure to an oxidative atmosphere at elevated temperature for a suitable interval. The desired interval will be one that imparts suitable functionalization without unduly degrading the spherical carbon material. Undue degradation can be defined as excessive reduction in one or more of diameter, pore volume, or specific surface area. In certain embodiments, monodispersed carbon spheres can be exposed to an elevated temperature between about 200° C. and 450° C. for an interval between about 15 seconds and 1 hour to impart hydrophilicity.

Hydrophilicity can also be expressed and achieved by the imparting surface charge to the porous carbon spheres by suitable methods. Porous carbon spheres having surface charge expressed as a zeta potential more negative than −15 mV are considered hydrophilic for purposes of this disclosure. In certain embodiments, the hydrophilic carbon spheres will have a zeta potential between −20 mV and −50 mV.

The hydrophilic carbon spheres will have an elevated porosity. The hydrophilic carbon spheres will have a pore volume between about 0.20 mL/g and 1.6 mL/g, with pore volumes between 0.9 mL/g and 1.0 mL/g being employed in certain specific embodiments. The hydrophilic carbon spheres can have any suitable porous surface configurations. The pores can be oriented in hexagonal type structure, cubic cage type structure, as well as a combination of hexagonal and cubic structure where the pores have a hexagonal orientation on the outside with a cubic orientation in the sphere interior. It is also contemplated that the porosity can be in a random or disordered fashion that provides "worm-like" mesopores. The size of the pores can be that suitable for subsequent processing with pore sizes between about 1.0 nm and 20.0 nm being contemplated in certain embodiments and pore sizes between 1.0 nm and 20.0 nm being contemplated in other instances. The size of the pores can depend, in part, on the organization of the pores on the sphere surface. Typically, randomly oriented pore structures exhibit larger pore sizes, while spheres with more ordered pore structure have smaller pore sizes.

In certain applications of this disclosure, the hydrophilic carbon spheres can be present as functionalized monodispersed starburst carbon spheres (MSCS). The monodispersed starburst carbon spheres as disclosed herein can include a central point and an outer surface positioned a spaced distance from the central point. Each carbon sphere is composed of carbon nanostructures that are configured as rods, tubes, dendrites, or the like. These carbon nanostructures are interconnected with one another and can radiate outward from the central point in spaced ordered relationship.

The carbon structure of each MSCS e is mesoporous in structure with the mesopores aligned radially from the center to the outside of each spherical particle. The MSCS's are characterized by high surface area and tunnel-like pores extending inward from the outer surface. In many embodiments, the outer surface has an ordered honeycomb structure in which the tunnels are aligned in ordered radially projecting orientation.

Suitable monodispersed microspheres disclosed herein are those referred to as monodispersed starburst carbon spheres (MSCS) that exhibit a characteristic starburst carbon structure with a high surface area defined as being greater than 500 $m^2/g$; with surface area values greater than 1000 $m^2/g$ and 1300 $m^2/g$ in many embodiments. The MSCS material disclosed herein also is characterized by porosity in the meso- and micro-levels. For purposes of this disclosure, microporosity is defined as a pore size approximately 1 nm, with pore sizes between about 1.0 nm and 20.0 nm being employed in certain embodiments. The MSCS disclosed herein can have a pore volume between 0.20 mL/g and 1.6 mL/g; with pore volumes between 0.20 mL/g and 1.0 mL/g being employed in certain embodiments. In monodispersed starburst carbon microspheres, it is contemplated that the pores will extend in ordered radial orientation from center to outer surface.

The monodispersed microspheres disclosed herein can have a suitable particle size sufficient to: a) form a functional dispersion capable of being dispensed to form a colloidal crystal structure; b) possess attributes and/or characteristics that enable the dispensed particles to self-align in ordered layered orientation. In certain embodiments, it is contemplated that the monodispersed carbon microspheres will have a particle size between about 120 nm and 1400 nm.

In various embodiments, the monodispersed carbon microspheres disclosed herein will have a zeta potential more negative than −15 mV, with zeta potentials between −20 mV and −50 mV being employed in certain embodiments.

The monodispersed microspheres may comprise at least one oxygen-containing moiety associated with the outer surface of the associated microsphere. Without being bound to any theory, it is believed that the presence of at least one oxygen moiety associated with the outer surface of the various spheres contributes to elevated surface potential. Non-limiting examples of such oxygen-containing moieties include at least one of hydroxyls, quinones, carboxylic acids, and the like.

The monodispersed microspheres as disclosed herein can be prepared by any suitable method. In situations where the microsphere is composed of carbon such as in MSCS particles, it is anticipated that the material will have a zeta potential more positive than −15 mV. Without being bound to any theory, it is believed that MSCS with zeta potentials at levels more positive than −20 m/V are difficult to bring into colloidal suspension. This difficulty is believed to translate into a disordered colloidal crystal or complete inability to form even a disordered colloidal crystal.

Also disclosed herein is a method to functionalize monodispersed starburst carbon spheres. In the method disclosed herein, MSCS are produced by any suitable method. One suitable method includes the synthesis of carbon from suitable carbon sources that are organized within a suitable mesopore template. The mesopore template can be composed of any suitable sacrificial material such as silica or the like. Once synthesized, the sacrificial material can be removed by any suitable method to yield non-functionalized monodispersed carbon starburst spheres of defined particle size, high surface area, and defined porous structure as outlined above.

The carbon microsphere material that is produced has a low surface potential that can be modified by the method disclosed herein. The monodispersed starburst carbon microspheres such as MSCS material can be exposed to an elevated temperature less than 450° C. in an appropriate atmosphere for an interval sufficient to impart at least one functional group onto the surface of the carbon microspheres such that the monodispersed starburst carbon microspheres have a surface charge more negative than −20 mV. The resulting material has a reduction in particle size that is less than 30% that of the untreated carbon microspheres. In particular applications the elevated temperature will be between 250° C. and 450° C. with a treatment interval sufficient to functionalize the various microspheres. In certain embodiments, it is contemplated that the treatment interval will be between 20 and 40 minutes.

The surface modification process can also include a suitable temperature ramp up step in which the microspheres are brought to treatment temperature over a defined interval. Once at treatment temperature, the material can be held at the treatment temperature for the prescribed interval. The process can also include a suitable cool down period to bring the MSCS to room temperature.

Hydrophilic carbon spheres, such as functionalized MSCS, that have ultra-high surface area can be used as a template for subsequent manufacturing processes. Hydrophilic carbon spheres, such as functionalized MSCS, can be incorporated into a suitable colloidal suspension where they yield a stable suspension that can be utilized to produce highly ordered colloidal crystals of high quality. The resulting suspension can comprise a suitable carrier medium such as an alcoholic solvent with the MSCS suspended therein. Materials such as alcohols, water and mixtures thereof are non-limiting examples of solvent material.

The present disclosure also is directed to a process for producing an inverse colloidal crystal such as an inverse opal that includes a step of orienting hydrophilic carbon spheres such as MSCS on a substrate in a highly ordered layered array. Particle orientation can be accomplished by precipitation convective assembly from a suitable colloidal suspension. In particular embodiments, the specific particles will be oriented in an ordered structure of at least one layer with configurations of two or more layers deep also being contemplated. In various embodiments, it is contemplated that the particles will be present in five or more oriented layers.

The process also includes the step of depositing a coating material onto the surface of the monodispersed microsphere template such that the administered coating material penetrates into pores defined in the carbon spheres. The degree of material penetration can vary depending on factors that include, but need not be limited to, the method of material administration, material administered, duration of application, etc. In various embodiments, it is contemplated that the applied material will penetrate into the pores to a depth that is equal to at least 25% of the average sphere radius.

In certain specific embodiments, the applied material may also form a conformal coating on the outside of at least a portion of the carbon spheres. Where this occurs, it is contemplated that the shell thickness will typically be less than the average pore size of the pores defined in the surface of the carbon spheres.

The coating material of choice can be a material chosen for its electronic and/or chemical activity or interactivity. Such materials include, but are not limited to, metals, chalcogenides, semiconductors, inorganic nitrides, inorganic oxides that can be applied by methods such as atomic layer deposition (ALD), chemical vapor deposition (CVD), chemical bath deposition, selective ionic layer adsorption and reaction (SILAR), or the like. Non-limiting examples of such materials include hafnia compounds, alumina compounds, Group II-VI compound semiconductors, AlN, and the like. Non-limiting examples of suitable semiconductor materials include Non-limiting examples of Group II-VI compound semiconductor materials include cadmium selenide, cadmium sulfide, cadmium telluride, zinc oxide, zinc selenide, zinc sulfide, zinc telluride, cadmium zinc telluride, mercury cadmium telluride and mercury zinc telluride. Non-limiting examples of inorganic oxides include titanium oxide (anatase, rutile and brookite), copper(I) oxide, copper(II) oxide, uranium dioxide, uranium trioxide, bismuth trioxide, tin dioxide. Chalcogenides include various sulfides, selenides and tellurides. Non-limiting examples of these are cadmium telluride and sodium selenide. Non-limiting examples of metals are hafnium, aluminum, nickel, tungsten, gold, silver, silicon, platinum, cobalt, chromium, titanium, molybdenum as well as oxides or nitrides of these metals. Non-limiting examples of suitable materials include $Si_3N_4$, GaN, GaAs, GaP, and AlN.

The coating material penetrates into the pores defined in the carbon spheres to form a connected network that extends inward. When the carbon sphere template is removed, the resulting inverse structure is characterized by a connected network of nanostructures objects including objects shaped like nanowires.

The coating material may be applied to a thickness that is below the pinch-off point for the given applied material. The pinch-off point is defined as the point where the pores between the porous microspheres becomes closed, and no further deposition of material into the interior of the colloidal crystal occurs. Using 484 nm diameter MSCS, it is contemplated that the nominal layer thickness at pinch-off is 37 nm.

The coating material will be applied in a manner that permits and/or facilitates material penetration into the pores located on the associated microsphere. In various embodiments, it is contemplated that penetration will be to a location that is at least half the depth of the associated pore or greater.

Once the coating material has been applied to the desired depth, at least a portion of the carbon that makes up the microsphere will be removed in a manner that maintains the applied coating material in a functional state. In many applications, this is taken to mean that the amorphous state of the deposited material is maintained and the material exhibits a minimal degree of crystallization and/or granularity. However controlled crystallization can be accomplished by annealing if desired or required.

In many embodiments, it is contemplated that the carbon microsphere template can be removed by a process involving thermal decomposition, oxygen plasma removal or a combination of both.

The material which can be produced from the process as described herein is an inverse opal composed of the deposited material that has the inverse structure to the ordered high surface area carbon opal that is characterized by nanostructures located on the inside of a defined spherical cavity.

Materials produced from the aforementioned process will have applications in a variety of end uses including, but not limited to, ion exchange media, catalysts, chemical separation and purification, energy storage devices and optoelectronic devices.

To further illustrate the present invention, the following examples are given. It is to be understood that these examples are provided for illustrative purposes and are not to be construed as limiting the scope of the present invention.

EXAMPLE I

Monodispersed starburst carbon spheres were synthesized according to the method outlined in Nakamura et al., *Microporous and Mesoporous Materials,* 2009, 117, page 478. A portion of the MSCS produced was made into a first series of ethanolic suspensions for opal formation through flow-induced deposition. Initial depositions of the as-synthesized carbon colloidal suspension formed disordered films instead of high quality opals. The monodispersed starburst carbon material prepared by the method described in section 2.3 on page 479 of Nakamura had a zeta-potential measurement of −14 mV. This was in contrast to the zeta-potential for silica particles which is −31 mV.

In order to accomplish opal fabrication, Piranha-cleaned substrates of glass or quarts were placed at a 20° angle in a 20 ml scintillation vial with 0.7 g colloidal suspension (0.5 to 2 wt. % in ethanol). The vials were placed in a Fisher, Isotemp 125 D incubator and held at 40° C. overnight.

EXAMPLE II

Methods for increasing the surface charge of monodispersed starburst carbon spheres were investigated in which the monodispersed starburst carbon spheres are functionalized. Samples of MSCS are heated in air at a temperature of 300° C., 400° C., 500° C. and 600° C. respectively for a hold interval of 30 minutes.

The MSCS were oxidized in a Lindberg Furnace using a 30 minute ramp to the desired temperature, 30 minute hold and then cooled to room temperature.

The results are summarized in Table 1. Significant shrinkage occurred at 500° C.; while at 600° C., no MSCS sample remained. These results indicate the carbon has been fully oxidized into volatile compounds which can include materials such as CO, $CO_2$ and the like. Samples heated in air at 300° C. and at 400° C. exhibited minor reductions in particle diameter.

To further verify the extent of particle degradation during oxidation, SEM micrographs were taken of the resulting drop-cast monodispersed starburst carbon spheres as depicted in FIGS. 1A, 1B and 1C. At temperatures of 300° C. and 400° C. for 30 minutes, little or no degradation occurred. This is evidenced by MCSC diameters of 475 and 473 nm respectively, compared to virgin MSCS (484 nm diameter). By oxidizing at 500° C., the MSCS are degraded to approximately half the original diameter (244 nm) and at 600° C., no MSCS sample remained.

Figure 2:
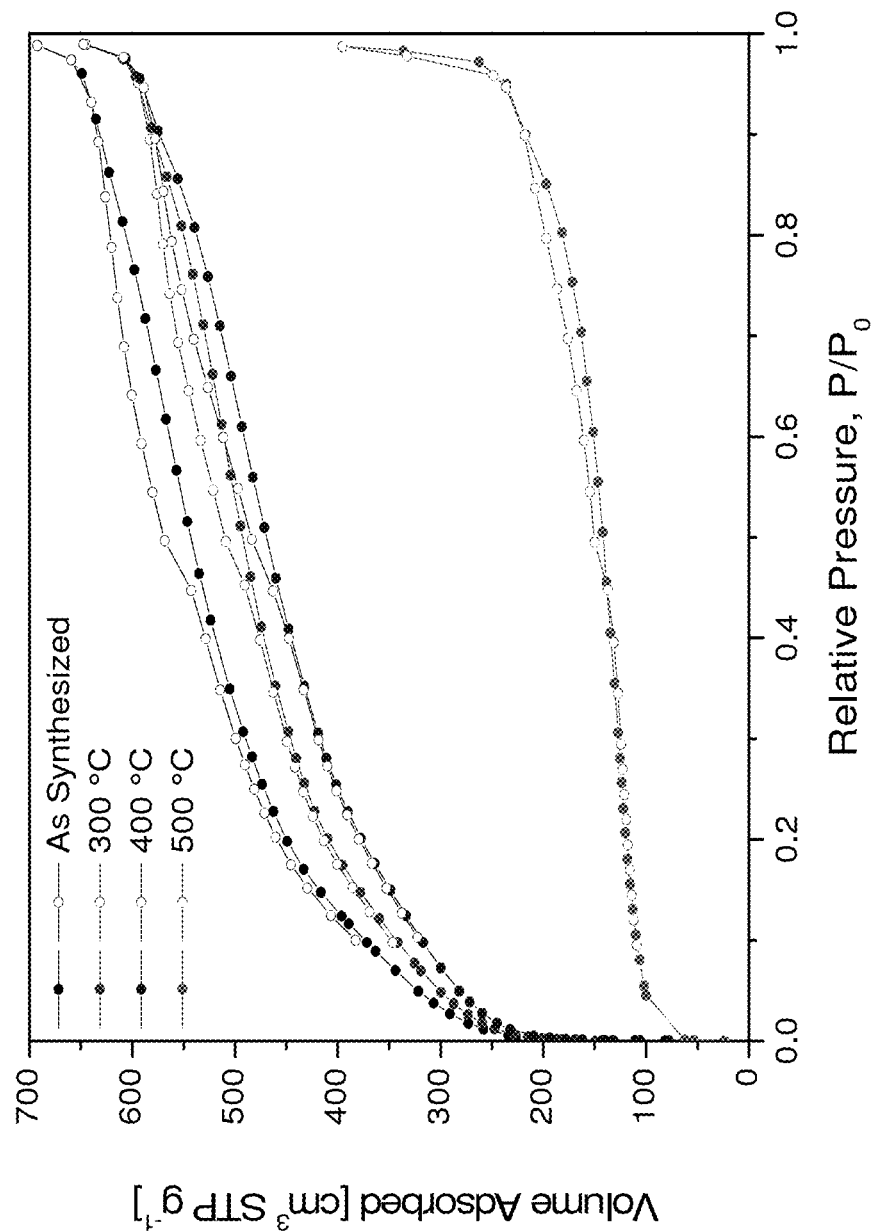
FIG. 2 is a plot of nitrogen adsorption and desorption of unoxidized MSCS and of MSCS that has been oxidized at varying temperatures.
Figure 3:
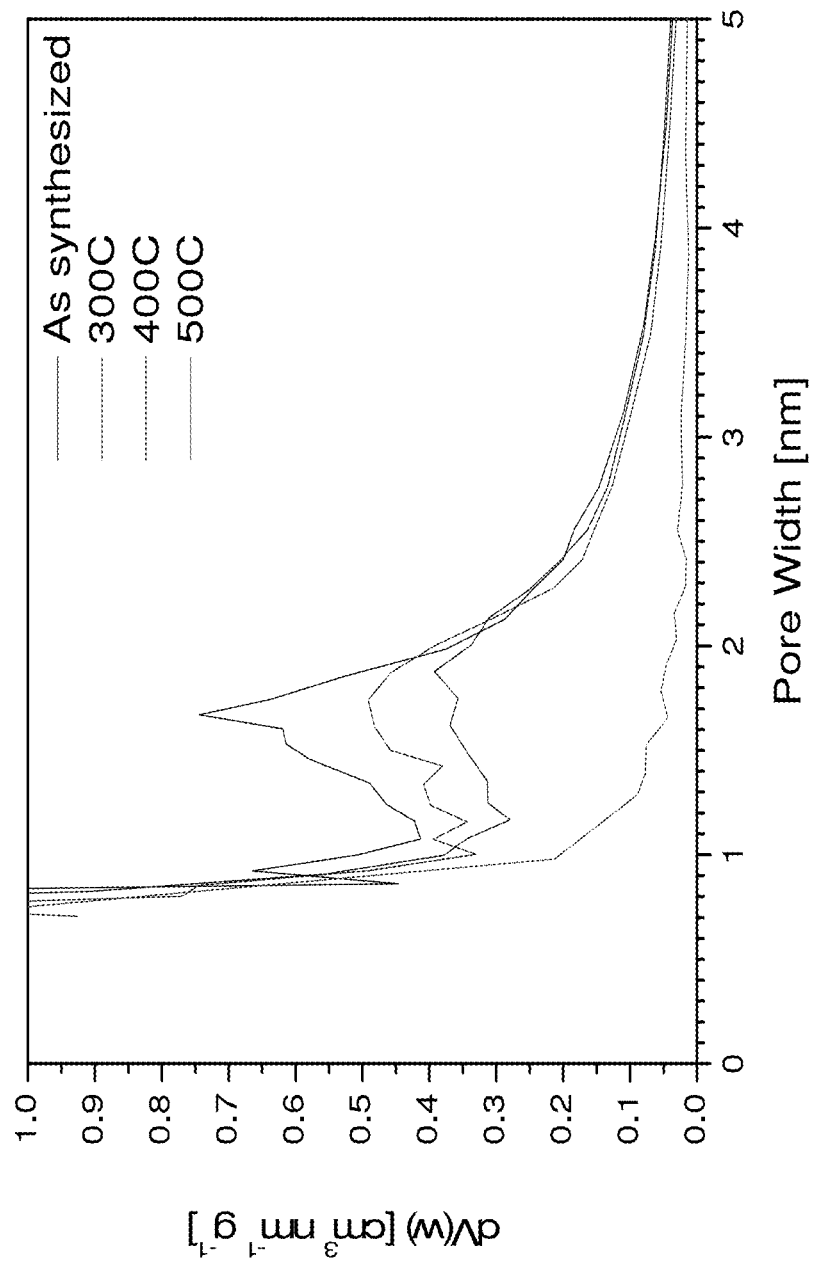
FIG. 3 is a depiction of calculated pore size distribution of the species of FIG. 2.
Figure 4A:
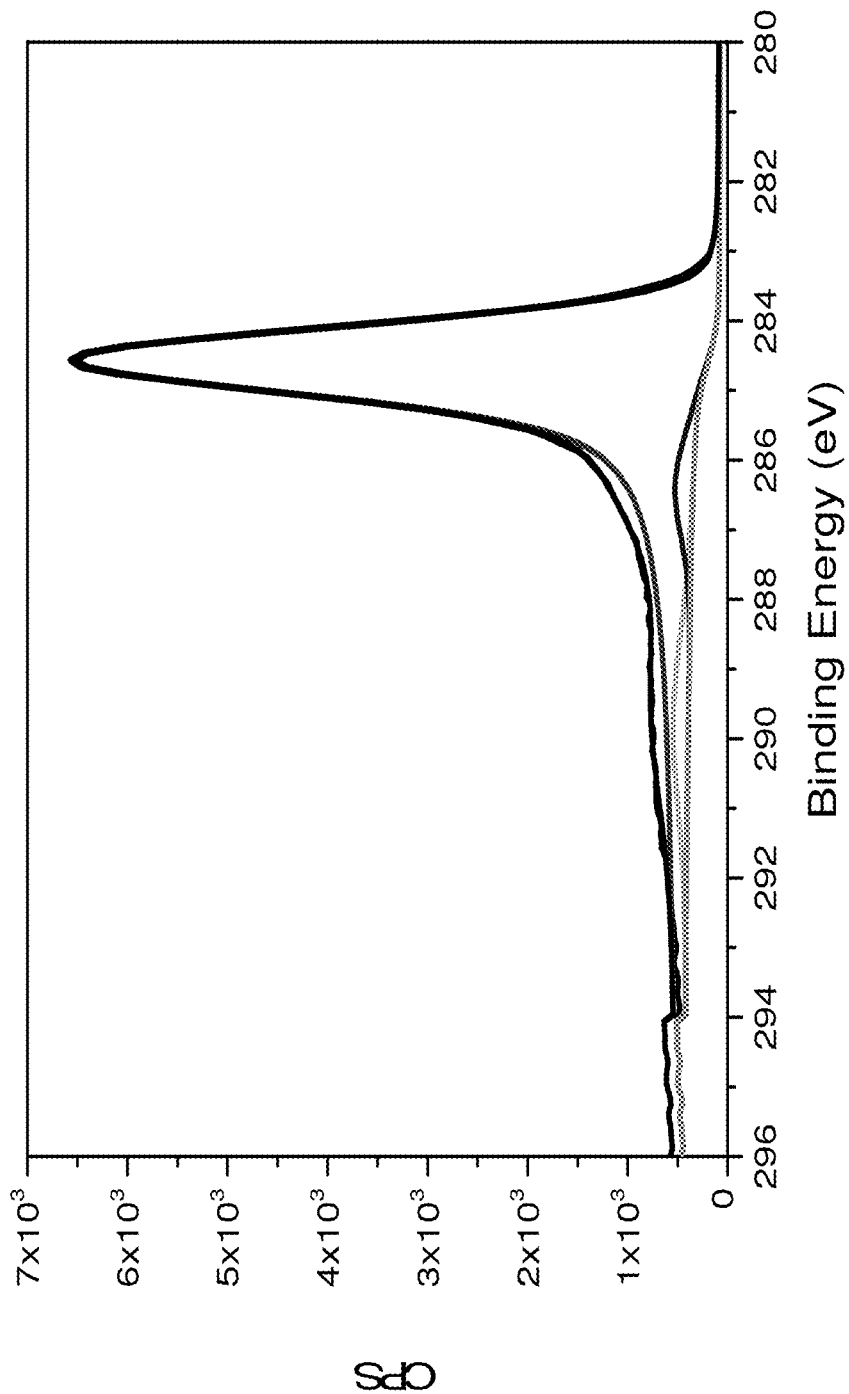
FIGS. 4A and 4B are graphic representations of X-ray Photoelectron Spectroscopy (XPS) C1s region for as-synthesized (a) and oxidized (b) MSCS at 400° C. with the main C—C set at a binding energy of 284.5 eV.
Figure 4B:
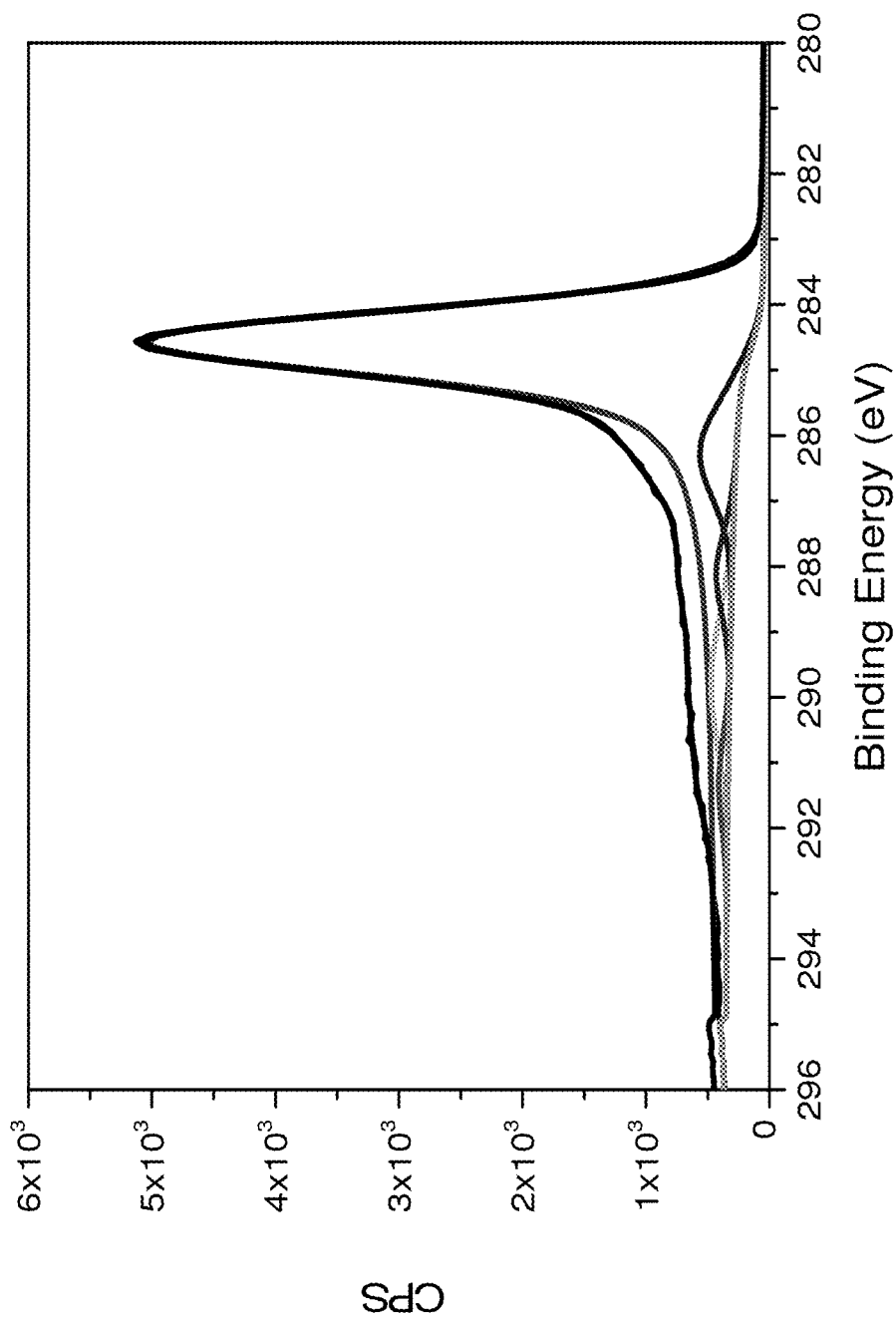

To verify that the porous structure of the MCSC remained through the oxidation, nitrogen adsorption measurements were conducted and the results are shown in FIG. 2 and FIG. 3 with pore volume, size and specific surface area tabulated in Table 1.

From the nitrogen adsorption measurements, MSCS oxidized at 300° C. and 400° C. demonstrated minor changes in properties such as minor decreases in pore volume with an increase in pore size, while maintaining ultra-high surface area of over 1300 $m^2/g$. However oxidation at 500° C. resulting in significant decrease in both pore volume and surface area with no clear pore distribution in the mesopore region. Nitrogen physisorption isotherms, BET specific surface area and pore volume were measured and calculated according to the procedures outlined by Nakamura et al.

TABLE 1

MSCS surface properties after heat treatment for 30 min.

| Heat treatment [° C.] | Diameter [nm] | Zeta Potential [mV] | Pore volume [mL $g^{-1}$] | Pore size [nm] | Specific surface area [$m^2$ $g^{-1}$] |
|---|---|---|---|---|---|
| As prepared | 484 ± 19 | −14 ± 6 | 1.00 | 1.67 | 1670 |
| 300 | 475 ± 7 | −26 ± 6 | 0.92 | 1.74 | 1490 |
| 400 | 473 ± 7 | −46 ± 4 | 0.92 | 1.87 | 1360 |
| 500 | 244 ± 10 | −34 ± 4 | 0.37 | — | 420 |
| 600 | — | — | — | — | — |

EXAMPLE III

To determine surface oxidation states that provide the surface charge measured, X-ray photoelectron spectroscopy (XPS) was conducted on two samples; namely the virgin MSCS and MSCS oxidized as at 400° C. as outlined in Example II. As illustrated in FIGS. 3A and 3B, the main C1s peak was set to a binding energy of 284.5 eV with a pi-pi* transition shifted 5.231 eV to 289.731 eV.

It was determined that the oxidized carbon had significantly more oxygen containing moieties such as hydroxyls, quinones and carboxylic acids (C—OH, C=O, C—OOH). These moieties are consistent with the increased surface charge measured for the oxidized MSCS. The material exhibited increased surface charge which, based upon the disclosure herein, can be employed in order to produce a more stable suspension.

TABLE 2

XPS data for virgin and 400° C. oxidized MSCS

| Bond | Binding Energy [ev] | XPS atomic bonding [%] | |
|---|---|---|---|
| | | As prepared | 400° C. |
| C—C | 284.5 | 97.5 | 92.0 |
| C—OH | 286.3 | 2.5 | 5.0 |
| C=O | 288.1 | 0 | 1.9 |
| C—OOH | 291.3 | 0 | 1.1 |

EXAMPLE IV

Figure 5:
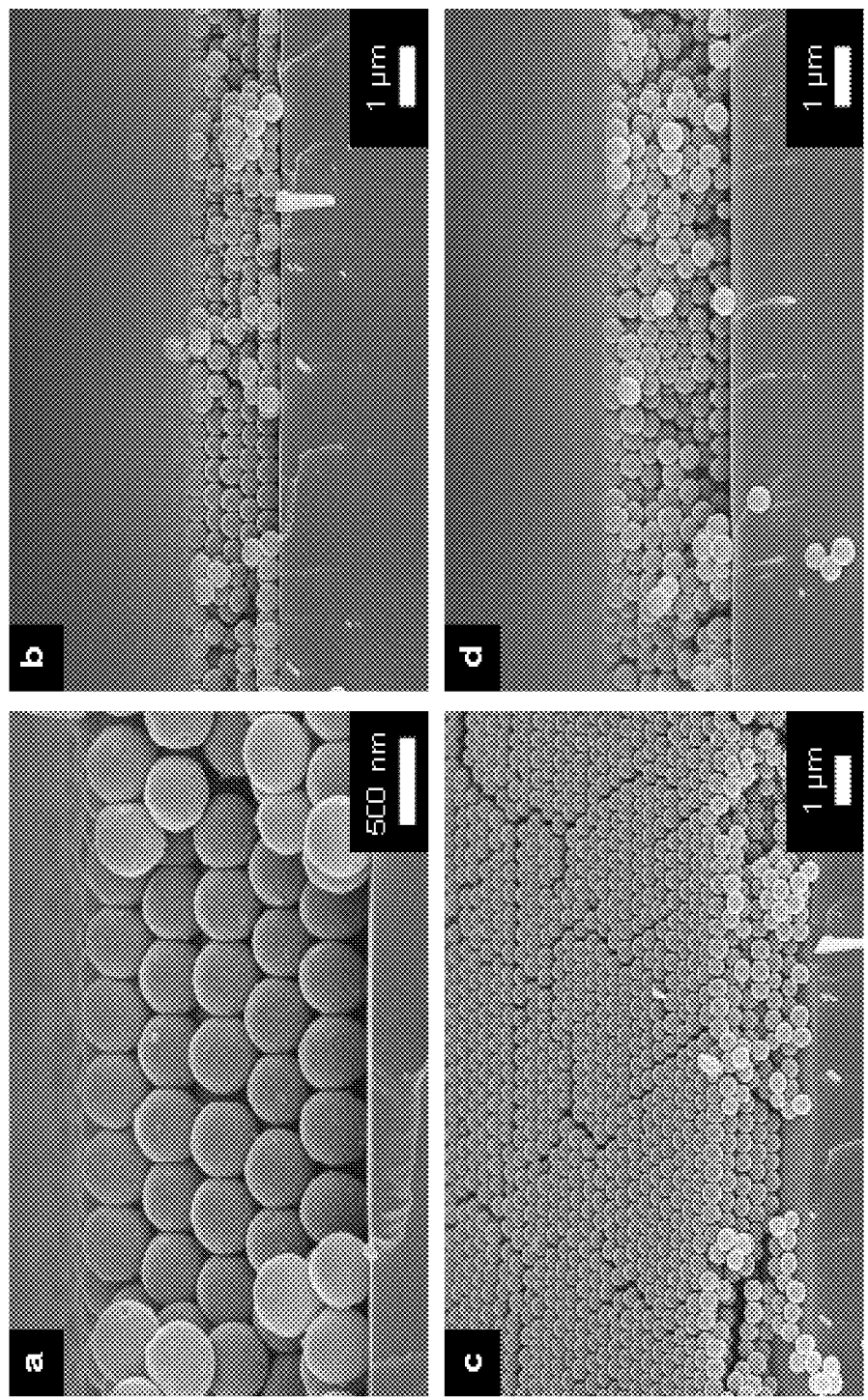
FIG. 5A is an SEM micrograph showing a cross-section of five MSCS layers of carbon opal fabricated according to an embodiment of the opal fabrication method disclosed herein using MSCS oxidized at 400° C.
FIG. 5B is an SEM micrograph showing cross-sections of five MSCS layers of carbon opal of FIG. 5A.
FIG. 5C is an SEM micrograph showing oblique views of the carbon opal of FIG. 5B.
FIG. 5D is an SEM micrograph showing a cross-sectional view of seven layers of a carbon opal produced according to an embodiment of the method disclosed herein.

The formation of suspensions using MSCS with increased surface charge was investigated. MSCS with increased surface charge was prepared according to the method in Example III. Opal formation according to the method outlined in Example II was attempted using MSCS oxidized at 300° C. and 400° C. respectively. The opals produced were inspected using SEM. The opals produced utilizing MSCS oxidized 400° C. were found to be more organized and generally were of higher quality. SEM photomicrographs of resulting 5-layer material are presented in FIGS. 5A, 5B and 5C; seven-layer material is presented in FIG. 5D.

Without being bound to any theory, it is believed that the higher quality opals produced by using 400° C. oxidized MSCS can be attributed, at least on part, to the increased stability of the suspension. This is due to the higher surface charge of the MSCS as compared to the as-synthesized material and to the 300° C. oxidized MSCS material. The zeta potential of the 400° C. MSCS material is −46 mV as compared to −14 mV for the as-synthesized material and −26 mV for the 300° C. material.

Figure 6:
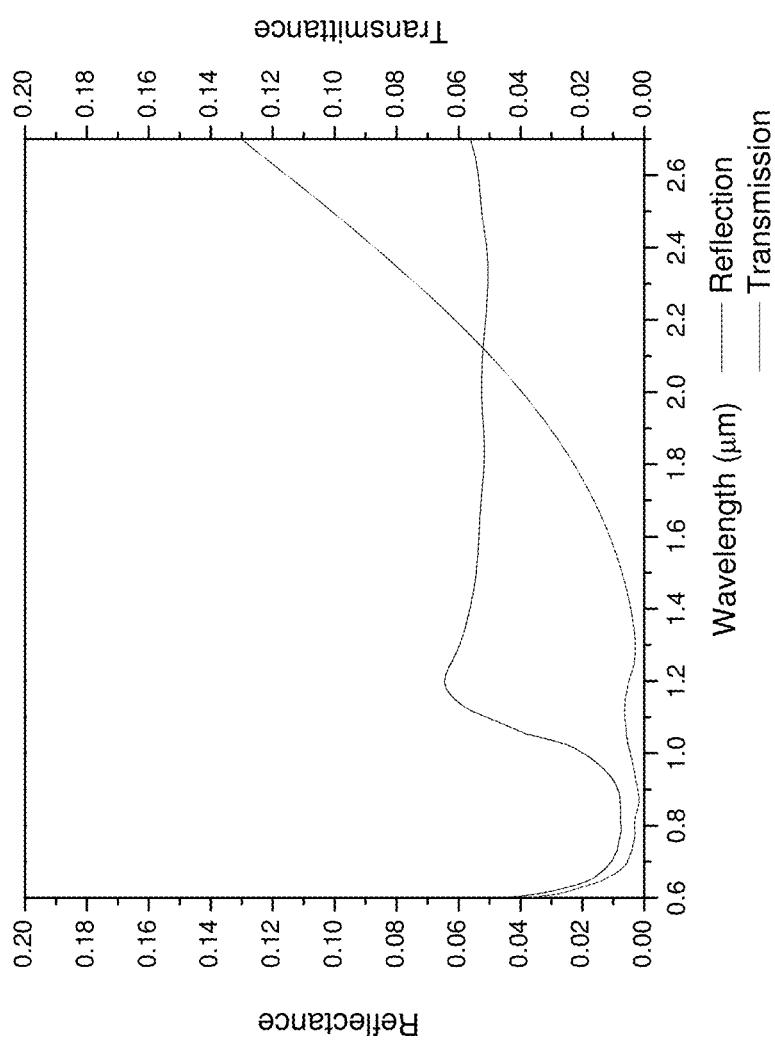
FIG. 6 is a graph of optical measurements of an MSCS opal produced according to an embodiment of the method as disclosed herein expressed as reflectance and transmittance versus wavelength.

As evidenced by the SEM micrographs, the opals produced demonstrate a high degree of order. The carbon opal produced is black. Due to the strong absorption characteristics of the resulting carbon opal, optical measurements that are typically employed to identify and characterize opals cannot be conducted. Representative optical measurements for carbon opals are set forth in FIG. 6 in which reflectance and transmittance are plotted as a function of wavelength.

EXAMPLE V

In order to determine the quality of the opal material produced in Example IV, the black carbon opal material produced was used as a sacrificial template for atomic layer deposition (ALD) of hafnium dioxide ($HfO_2$, or hafnia). This process allowed for investigation using the optical properties of both the MSCS opal template and the hafnia inverse structure.

In order to accomplish this, 300 cycles of hafnia ALD were performed in order to deposit a layer nominally 30 nm thick (0.1 nm/cycle). The hafnia ALD was accomplished using a Cambridge Nanotech ALD system operated at 200° C. on fabricated carbon opals with a recipe having a growth rate of 1 angstrom per cycle. This deposition level was below the pinch-off point for the deposited hafnia material at 37 nm for the 479 nm colloid; that is where the interstices fill and block further precursor. The recipe for hafnia ALD employed is outlined in Table 3.

TABLE 3

Hafnia ALD Recipe

| | Instruction | # | Value |
|---|---|---|---|
| 0 | Flow | | 20 sccm |
| 1 | Heater | 9 | 200° C. |
| 2 | Heater | 8 | 200° C. |
| 3 | Stabilize | 8 | |
| 4 | Stabilize | 9 | |
| 5 | Wait | | 600 s |
| 6 | Pulse H$_2$O | 0 | 0.015 s |
| 7 | Wait | | 10 s |
| 8 | Pulse Hf(NMe$_2$)$_4$ | 1 | 0.20 s |
| 9 | Wait | | 10 s |
| 10 | Goto | 6 | m[a] |
| 11 | Flow | | 5 sccm | m denotes number of cycles; with 60, 100 and 300 being employed

EXAMPLE VI

Figure 7:
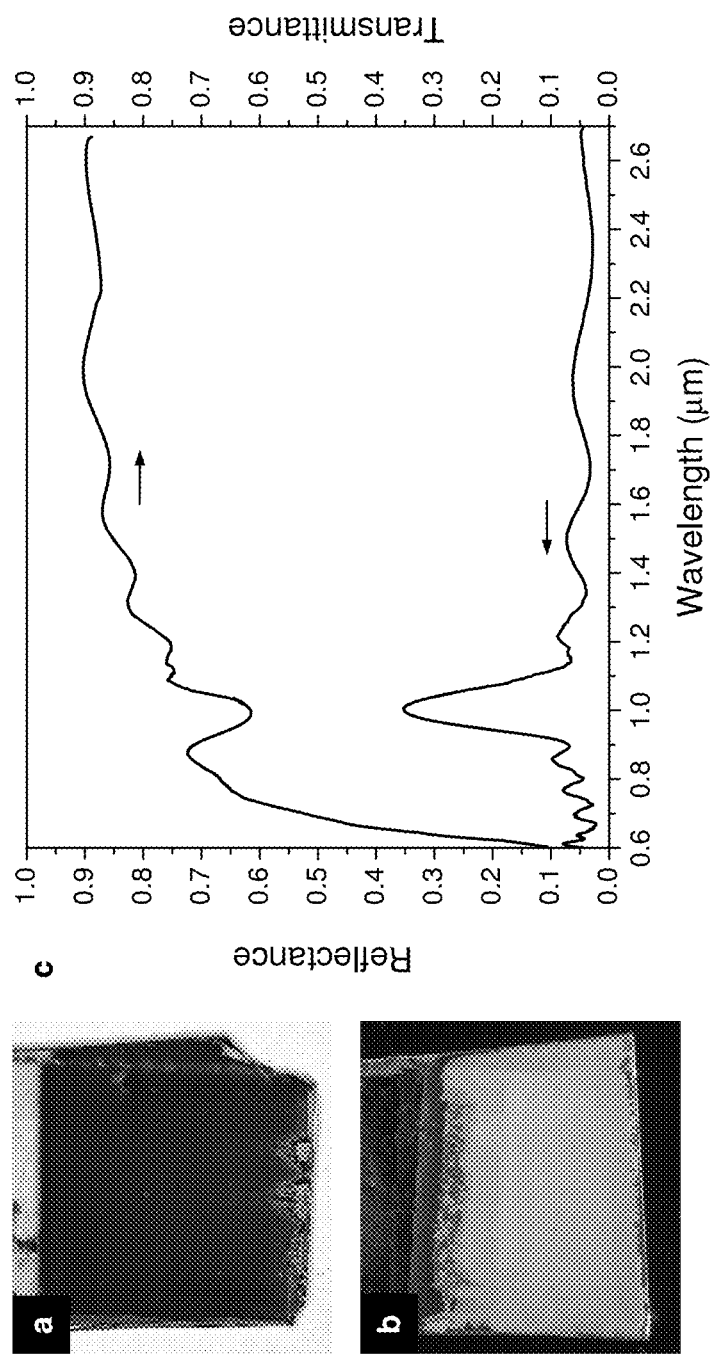
FIG. 7A is a photographic representation of a carbon opal of the type shown in FIGS. 5A-5D, the carbon opal having been coated with hafnium dioxide (hafnia) via 300 cycles of atomic layer deposition (ALD)
FIG. 7B is a photographic representation of of a hafnia inverse opal prepared by thermal carbon removal from the hafnia-coated carbon opal of FIG. 7A.
FIG. 7C is a graph of optical measurements of the hafnia inverse opal of FIG. 7b, expressed as reflectance and transmittance versus wavelength.

The material produced in Example V was further analyzed. After a brief reactive ion etch (RIE) to open up the top hafnia surface, carbon present in the opal was thermally removed by exposing the material to temperatures of 600° C. for 1 hour. Before and after optical images are shown in FIGS. 7A and 7B, respectively. The sample substrates illustrated are each 1 cm in width. The material before etch exhibited a generally black surface as is expected with the presence of carbon. The material after thermal removal presented as a pale pink material indicative of carbon removal.

The reactive ion etch (RIE) process employed to open the top of the hafnia surface used O$_2$ and CF$_2$ gasses at 1 sccm each, 10 mTorr, 75 W, 1 nm/min removal. The process was performed in order to expose the MSCS for subsequent carbon removal by either thermal or oxygen plasma removal procedures.

For analytical purposes, thermal removal of the carbon was chosen because, unlike wet etching or RIE of a silica template for hafnia, the thermal removal method employed was completely orthogonal to hafnia removal. Thus fine features of the hafnia were maintained. Optical measurements, taken on the defect-free region in FIG. 7B are shown as wavelength versus reflectance/transmittance. These measurements show a main reflection peak at 1.0 micrometers of 35%, with well-defined Fabry-Perot fringes. As the MSCS opal was the template for the high-quality hafnia inverse structure, one can deduce that the MSCS opal was also of high quality.

EXAMPLE VII

Figure 8A:
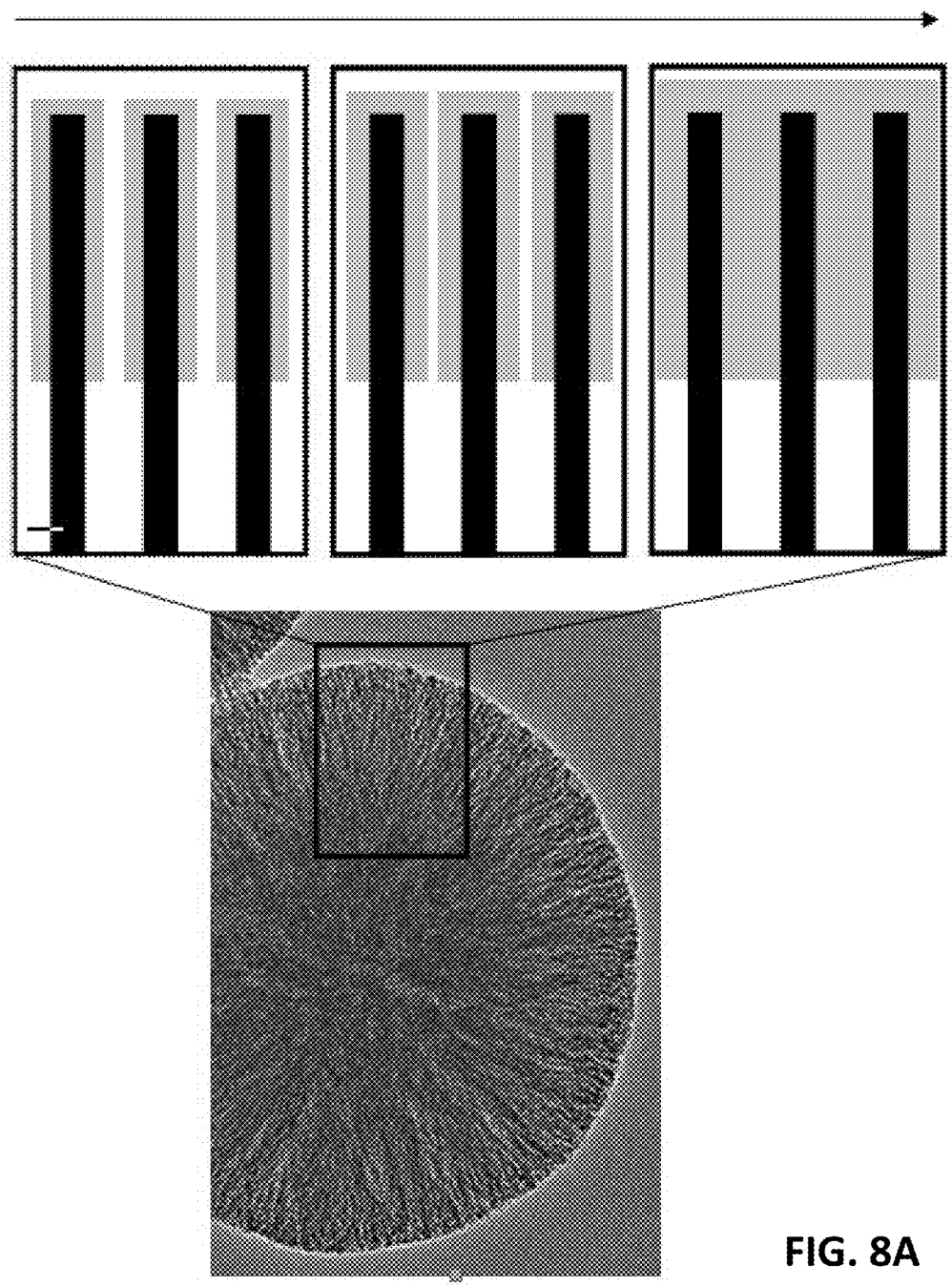
FIG. 8A is a schematic representation of hafnia ALD deposition onto MSCS according to an embodiment as disclosed herein.
Figure 8B:
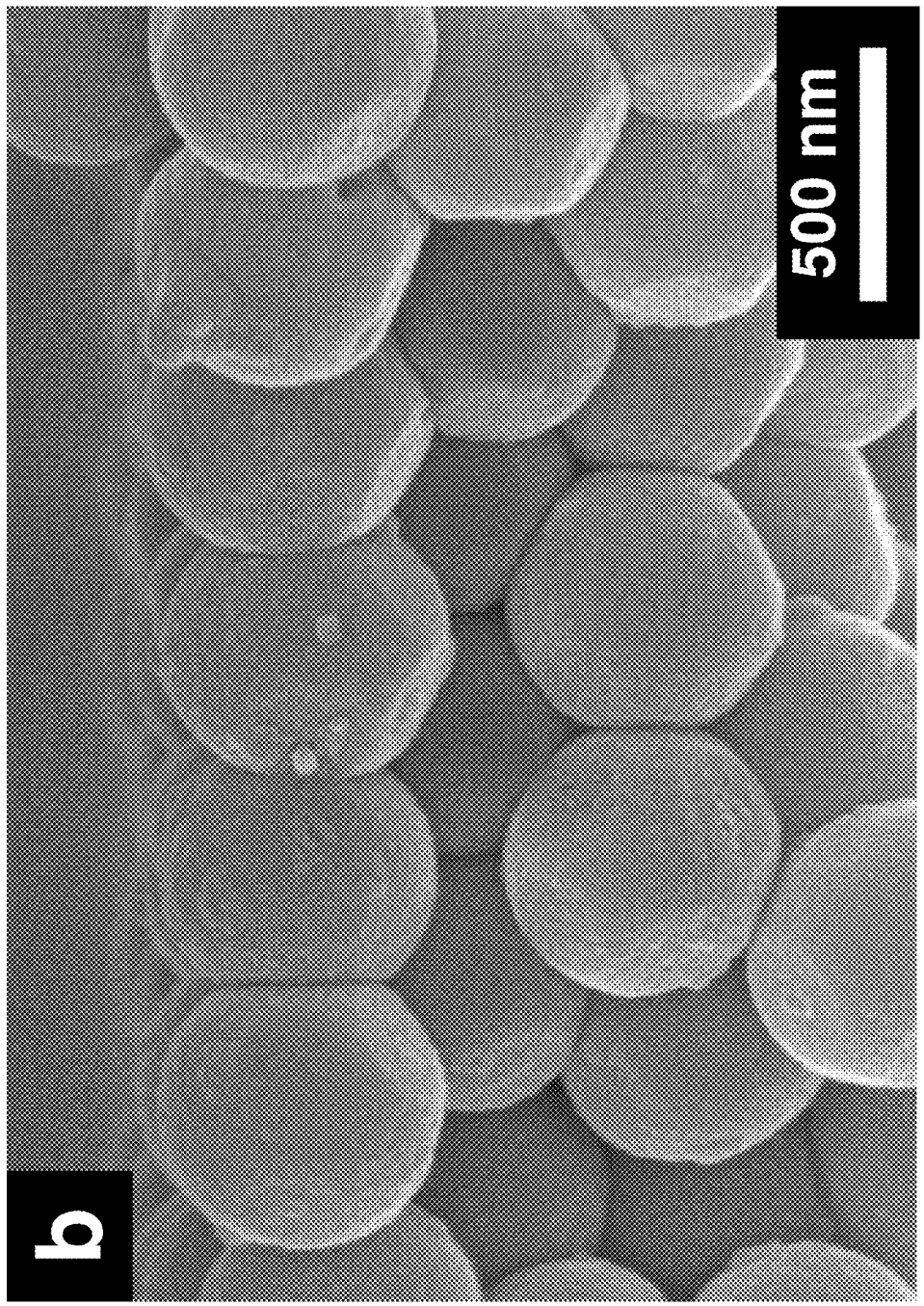
FIG. 8B is an SEM micrograph of a cross section of carbon opal coated with hafnia, of the type shown in FIG. 7A.

The process through which an ALD coating penetrates the pores present on MSCS was investigated and documented using hafnia as the deposition material as outlined above. It was theorized that the ALD hafnia coating penetrates the pores on the surface of MSCS under suitable deposition conditions. The deposition processes outlined above were employed to test this hypothesis. Scanning electron micrograph (SEM) images of materials present at various stages of the inverse opal preparation process are shown schematically in FIGS. 8A through 8H. FIG. 8A is an SEM of an individual MSCS. Scanning electron microscopy was performed using a Hitachi S-4700 or S-4800.

In the ALD process, hafnia precursors are released into a vacuum chamber sequentially with suitable dwell times after each injection. The dwell times permit each precursor to infiltrate, adsorb and decompose into hafnium dioxide (i.e. hafnia) on all of the MSCS surfaces, including inside the pores. Increasing dwell time was found to increase the probability of deeper pore penetration. Hafnia was chosen for the robustness and optical characterization qualities that the material provides. In the present example, the hafnia precursor is (tetrakis(dimethylamido)hafnium (Hf(NMe$_2$)$_4$) according to the recipe outlined in Table 3.

Figure 8C:
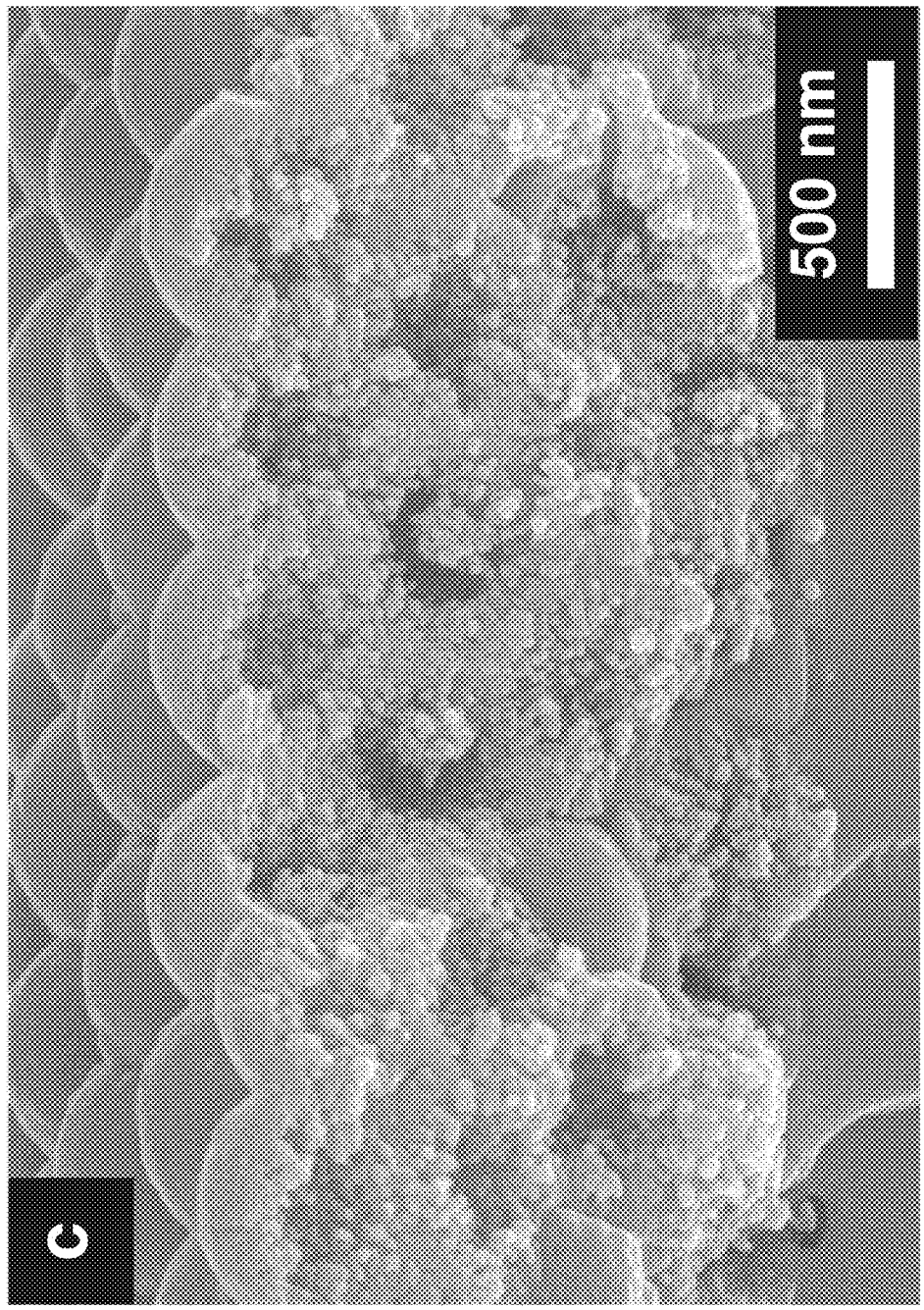
FIG. 8C is an SEM micrograph of a hafnia inverse opal of the type shown in FIG. 7B.

The process results in the surface of the MSCS being conformally coated with hafnia. After thermal removal of the MSCS, a thick, porous hafnia shell remained with projections that penetrate deep into the central region of the shell. This was formed from penetration of hafnia into MSCS vacancies as a result of the ALD process. An SEM (500 nm scale bar) of a carbon opal conformally coated with 300 ALD cycles of hafnia to produce a nominal layer of 30 nm can be seem at FIG. 8B. Three hundred cycles was chosen as being under the pinch-off point of 37 nm. The penetration of hafnia into vacancies in the MSCS is evidenced in the SEM of FIG. 8C shown (500 nm scale bar).

EXAMPLE VIII

Further investigation of hafnia infiltration was conducted by performing the hafnia ALD process as outlined in Example VII. However the process was discontinued after 100 cycles in order to produce a nominal layer of 10 nm.

Figure 8D:
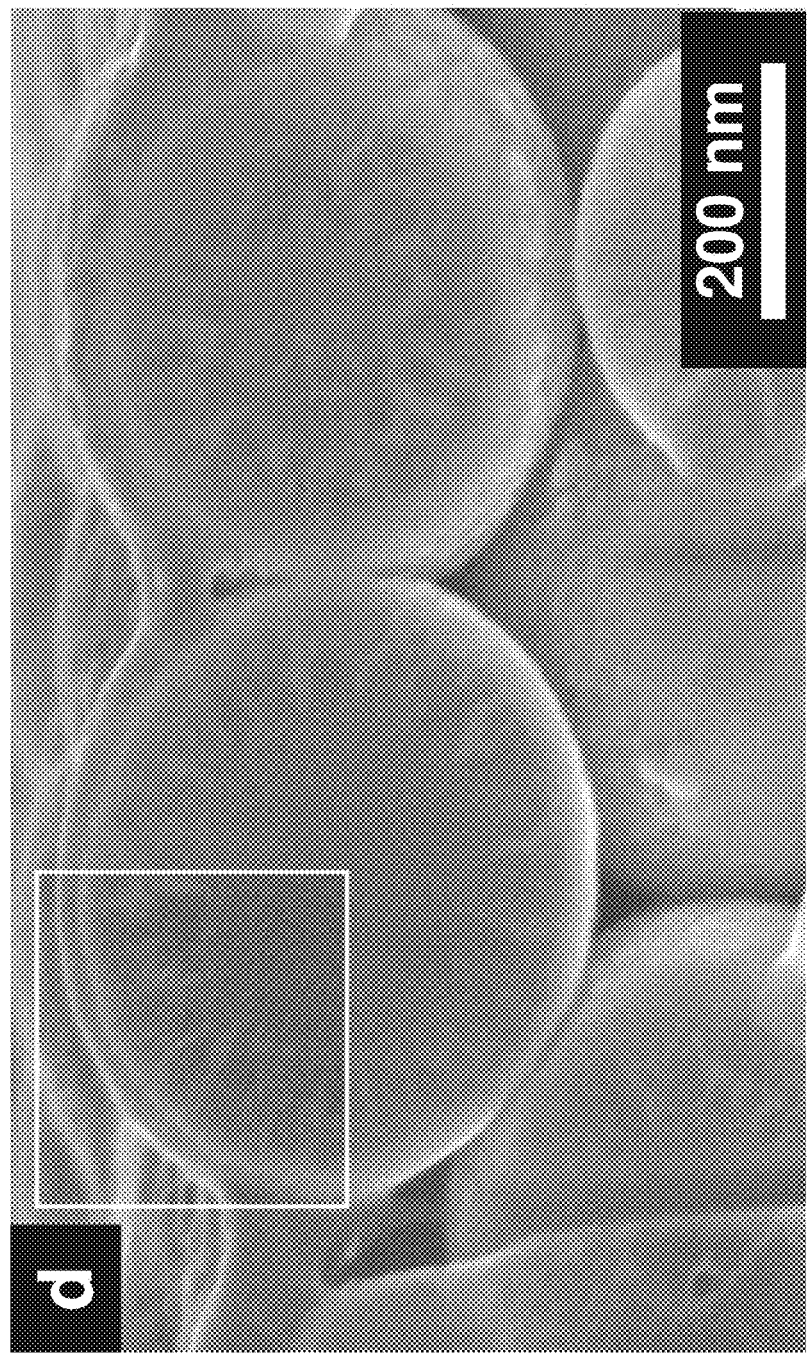
FIG. 8D is an SEM micrograph of a FIB cross-section cut of a hafnia coated carbon opal of the type shown in FIG. 7A, but in which the carbon opal was coated with hafnia via 100 cycles of ALD.

Focus Ion Beam (FIB) milling was done on the opal template prior to carbon removal as illustrated in SEM of FIG. 8D, (200 nm scale bar). The SEM in FIG. 8D shows a thick sputtered gold coating done for FIB milling that is visible on the top of the opal. After the FIB milling operations were completed, no gold was coated on the exposed surface. Carbon present in the micrograph appears darker than the hafnia due to its low atomic number. The micrograph shows a bright hafnia shell with hafnia spokes penetrating into the MSCS. The hafnia penetrates far greater that much farther than the 10 nm that was nominally deposited as a result of the 100 cycle ALD. Measurements indicate that the hafnia infiltrates to a depth of approximately 80 nm.

EXAMPLE XIX

Figure 8E:
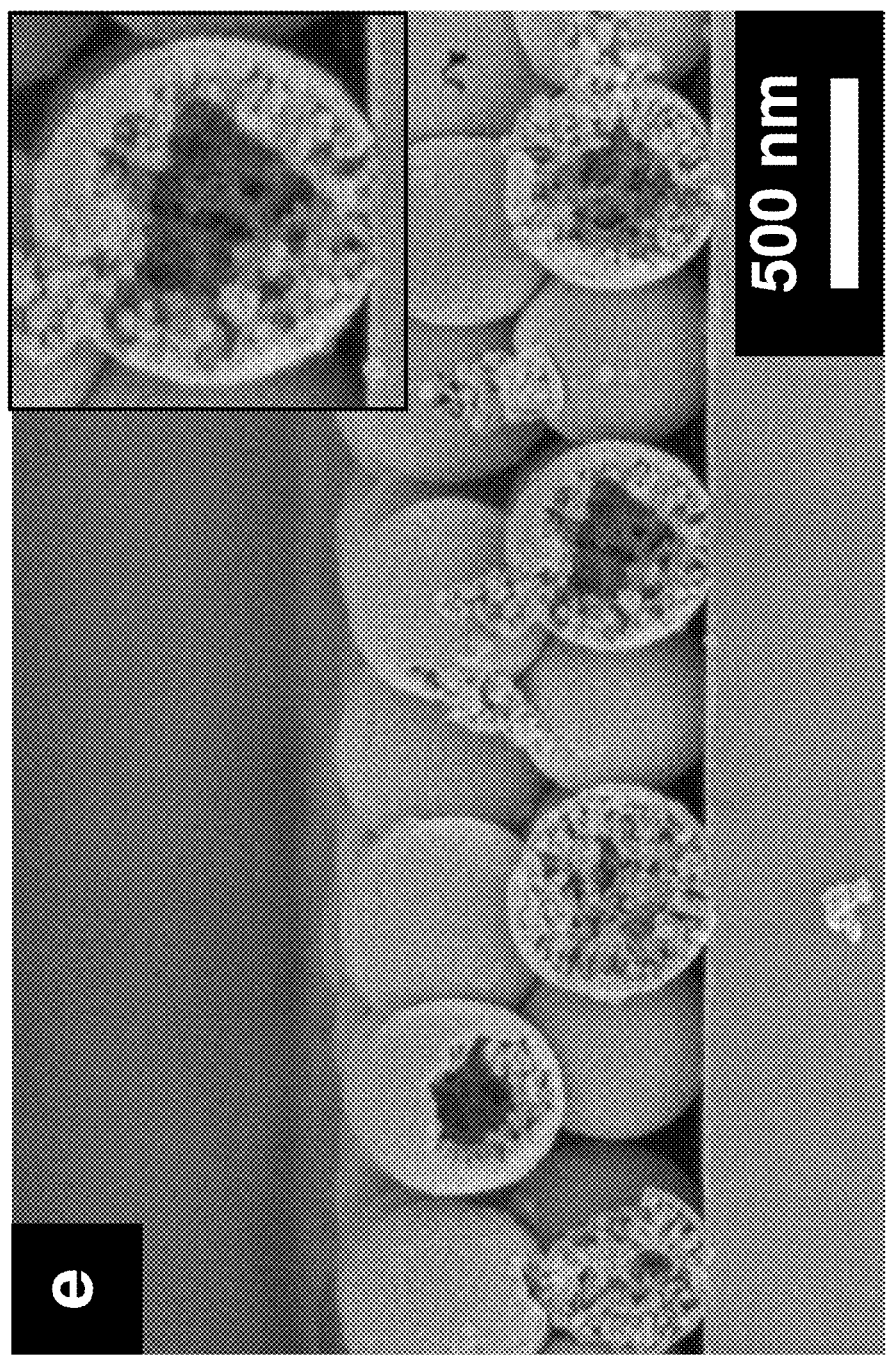
FIG. 8E is an SEM micrograph of a cross-sectional fracture surface of a hafnia inverse opal prepared by thermal carbon removal from the hafnia coated carbon opal of FIG. 8D.
Figure 8F:
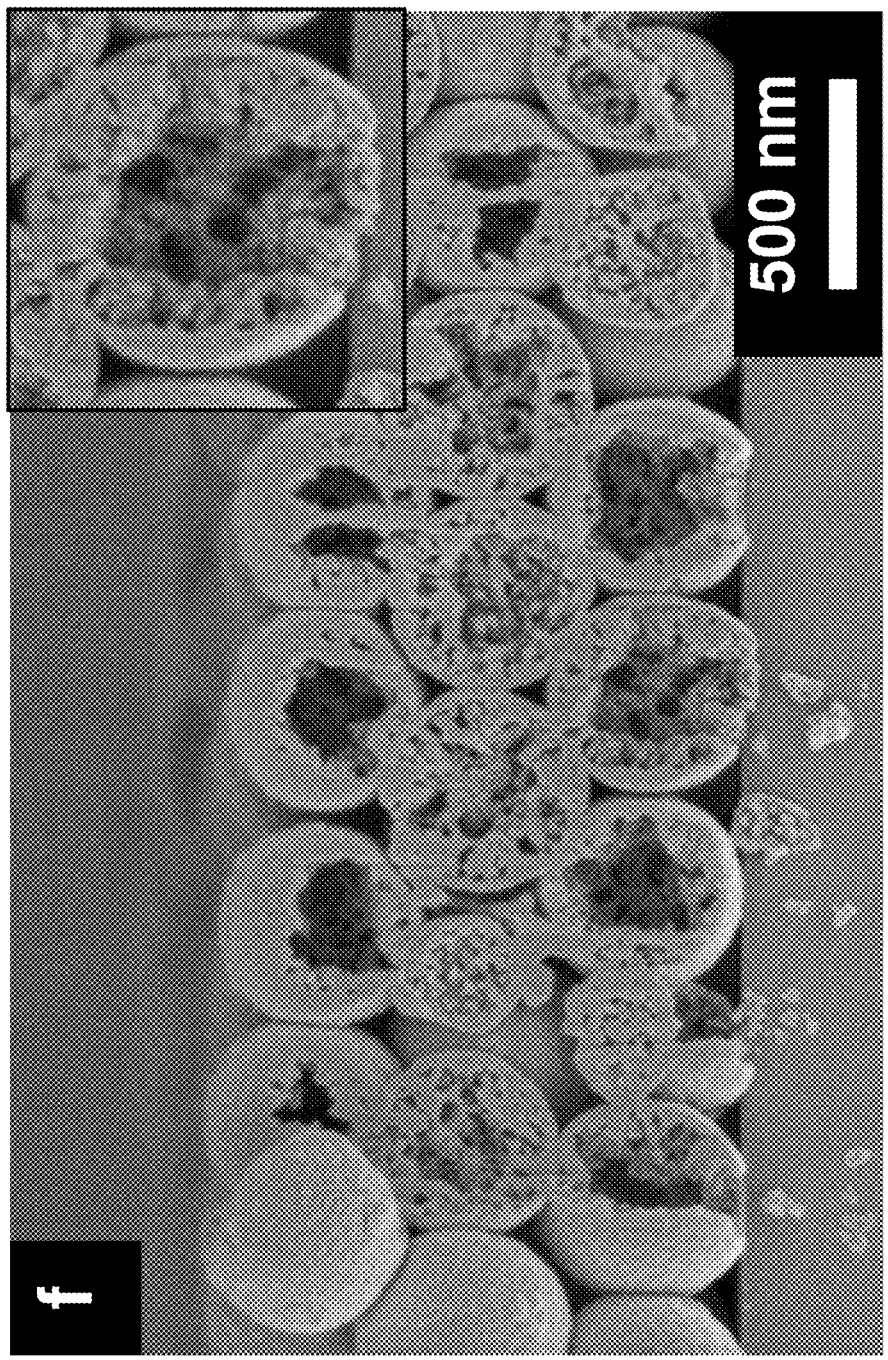
FIG. 8F is an SEM micrograph of an FIB cross-sectional cut of the hafnia inverse opal of FIG. 8E.
Figure 8G:
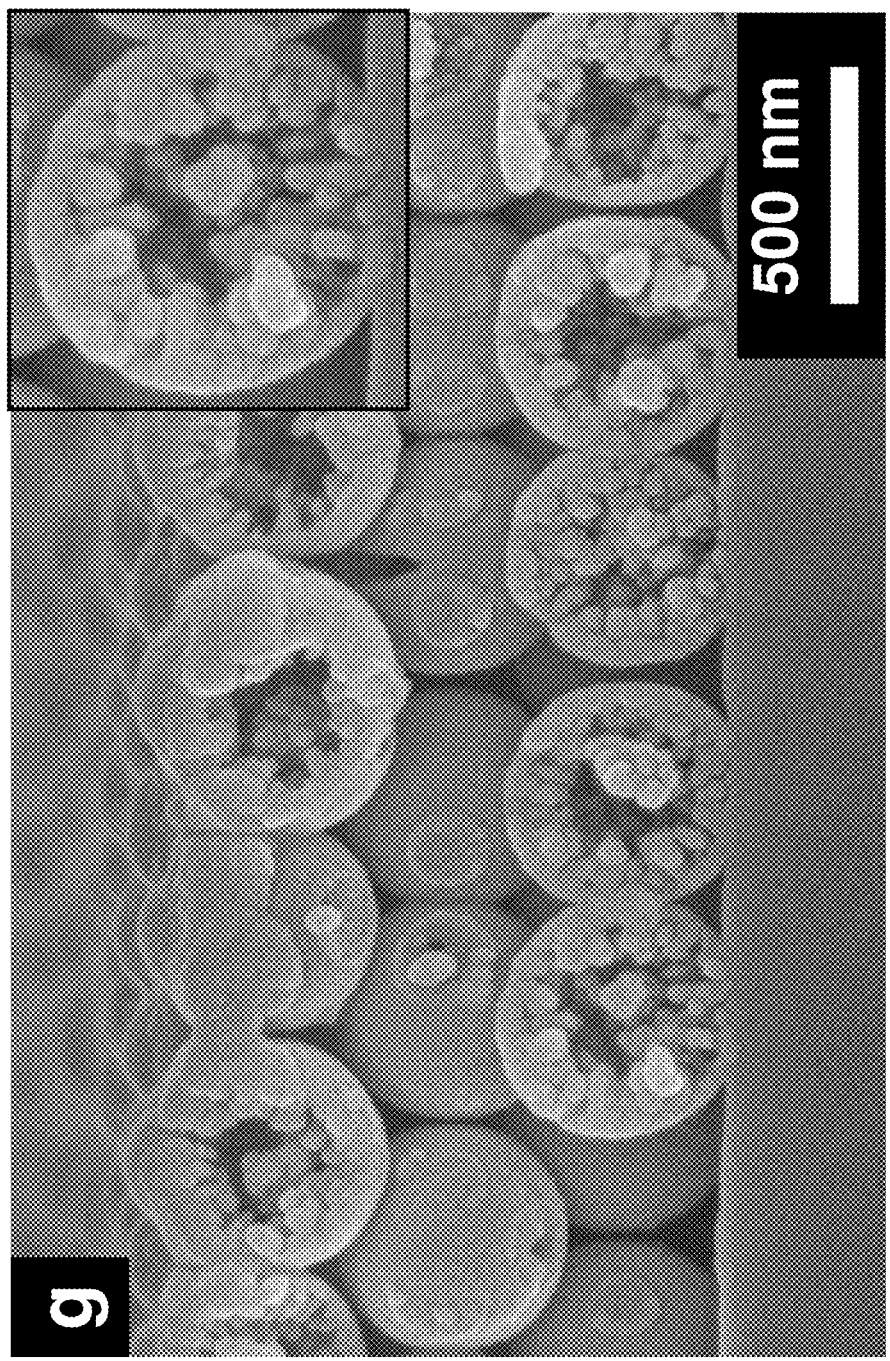
FIG. 8G is an SEM micrograph of a cross sectional view of a fracture surface of a hafnia inverse opal prepared by oxygen plasma carbon removal from the hafnia coated carbon opal of FIG. 8D.

Characteristics of the hafnia inverse structure were investigated further upon removal of the MSCS structure. FIG. 8E shows the inverse structure achieved by fracturing. FIG. 8F shows another spot on the same sample that was focus ion beam (FIB) milled using a FEI Beam 235 FIB at low current. Even though the milling process used a low current of 10 pA, some coalescing of the hafnia can be seen. Some granular hafnia structure was evidenced. It is theorized that the hafnia crystallization occurs during the thermal MSCS removal.

EXAMPLE X

Figure 8H:
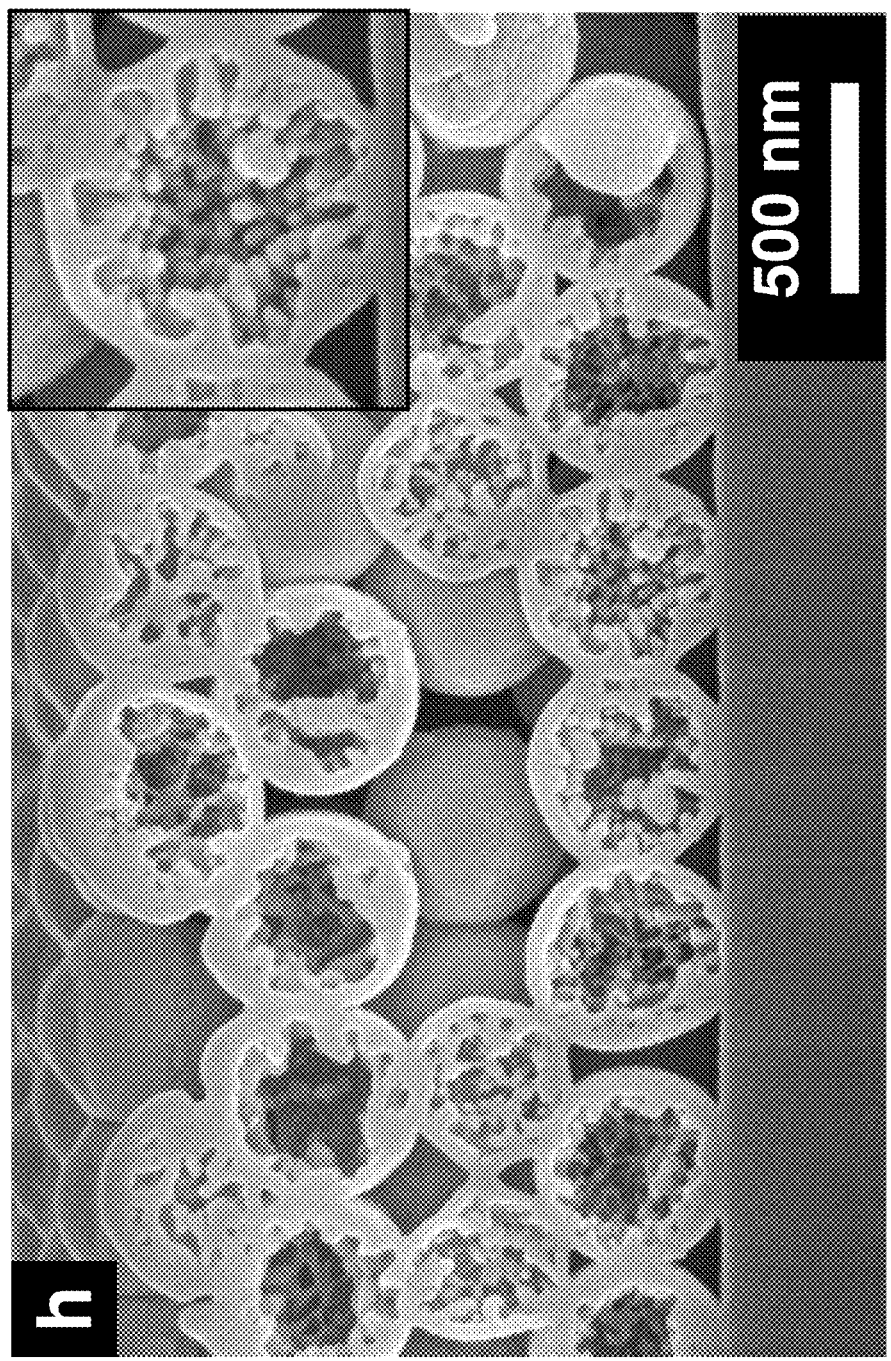
FIG. 8H is an SEM micrograph of a FIB cross-sectional cut of the hafnia inverse opal of FIG. 8G.

A control experiment was conducted in order to keep hafnia in its as-deposited state by oxygen plasma removal of the carbon in the MSCS opal done under conditions of 20 sccm $O_2$ at 400 mTorr, 200 W for 2 hours. In order to accomplish this, hafnia-coated MSCS opal was exposed to a RIE etch to open the top hafnia surface after which oxygen plasma was conducted to remove the MSCS. The resulting fracture surface can be seen in FIG. 8G and the FIB cut is depicted in FIG. 8H. These contrast with the thermally removed MSCS in FIGS. 8E and 8F. The material in FIGS. 8G and 8H were found to have a smooth, denser structure as opposed to the granular structure produced by the thermal MSCS removal. The as-deposited hafnia was found to replicate the ultra-high surface area MSCS.

Without being bound to any theory, it is believed that in the thermal removal process, grain growth and sintering in the hafnia occurs simultaneously with the carbon removal. It is believed that the nanometer-scale hafnia wires that penetrate the MSCS coarsen or sinter. This coupled with the concurrent removal of the MSCS support concurrently, allows the nanowires to detach from the hafnia shell. Upon fracture, the particles are dislodged and emptied.

EXAMPLE XI

Figure 8I:
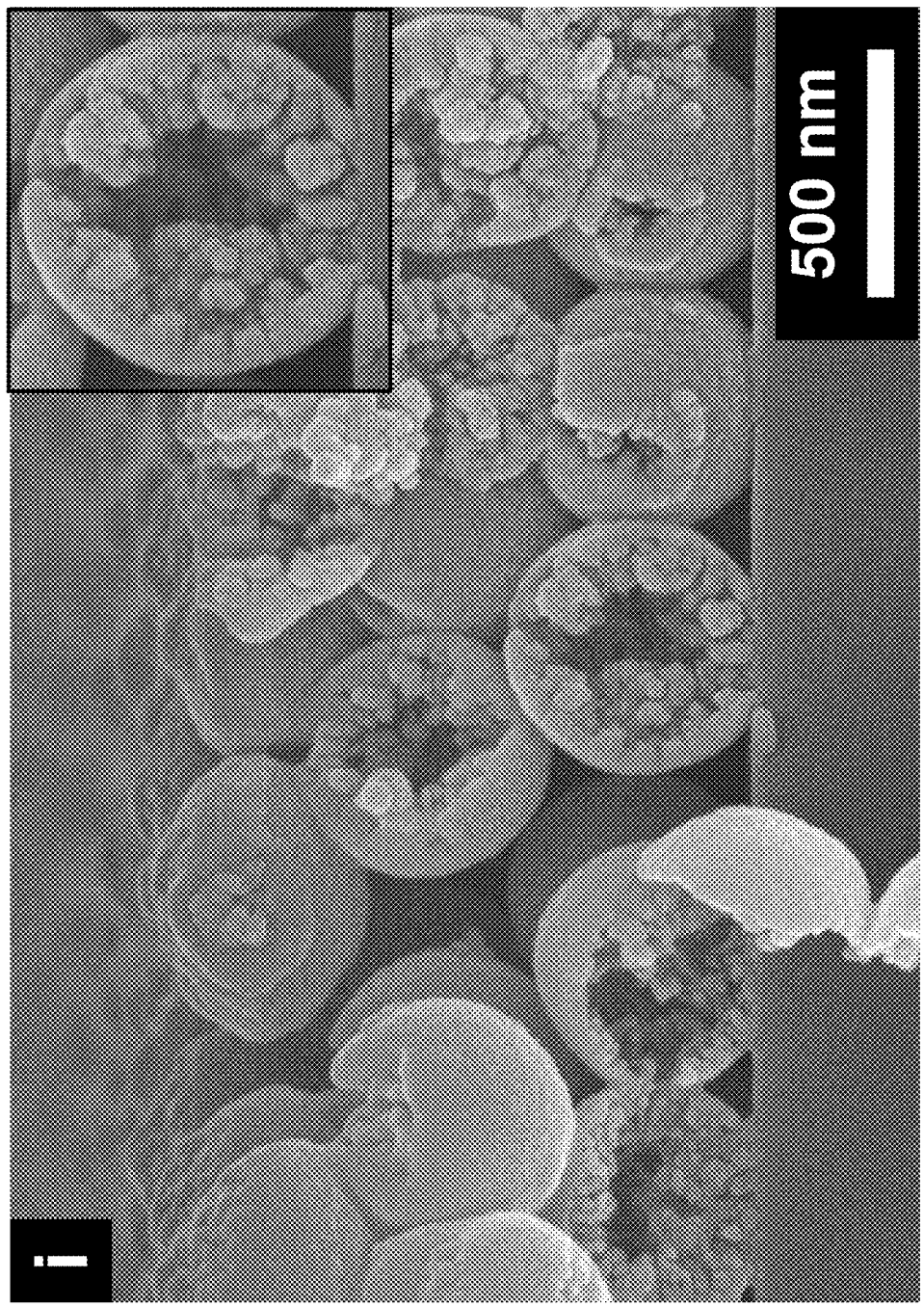
FIG. 8I is an SEM micrograph of a cross-sectional fracture surface of hafnia inverse opal of the type shown in FIG. 8G, but which was subjected to heat treatment under non-oxidative conditions.
Figure 8J:
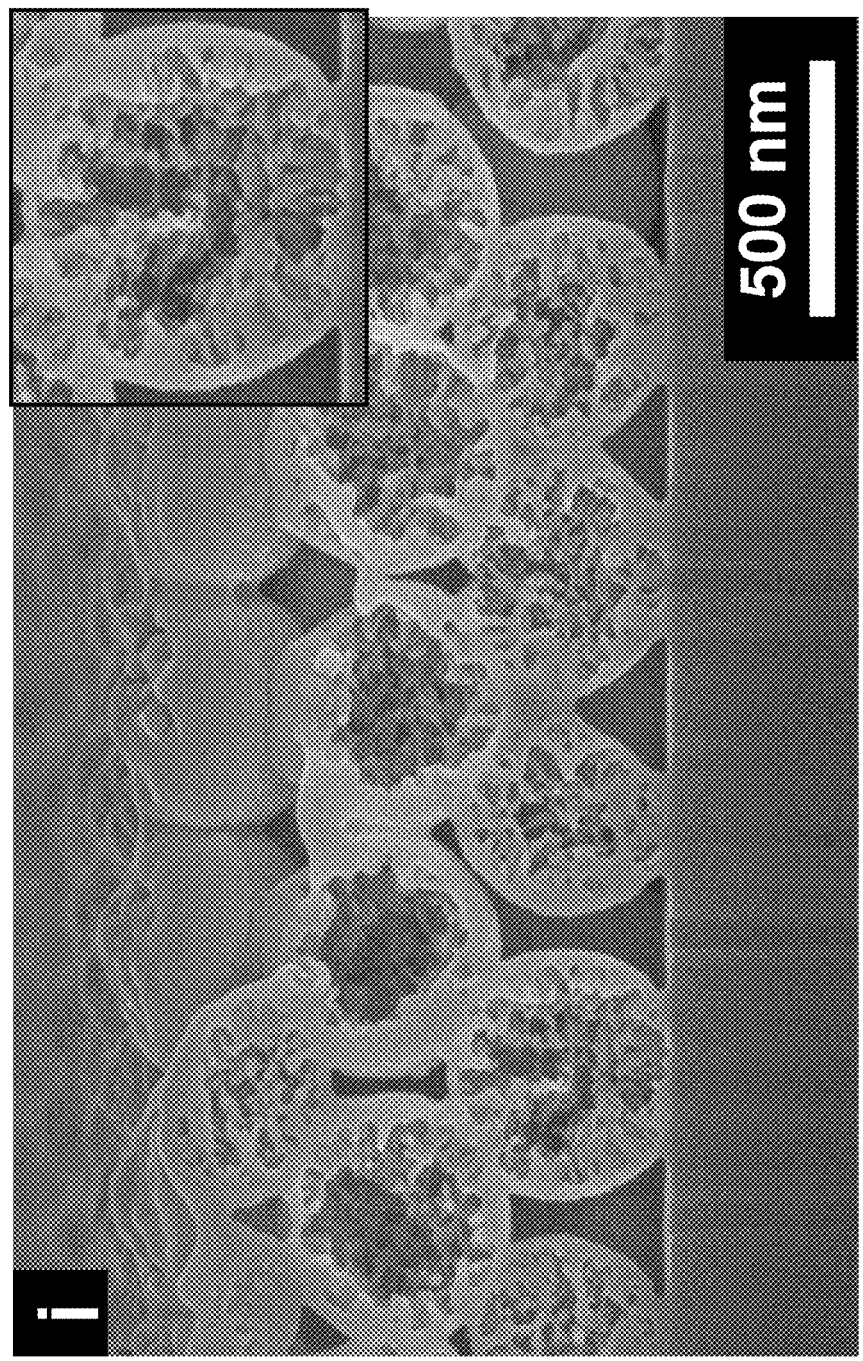
FIG. 8J is an SEM micrograph directed to an FIB milled cross sectional cut of the hafnia inverse opal of FIG. 8I.

To verify the hypotheses advanced in Example X, two experiments were conducted. In the first experiment, 100 cycles of ALD hafnia were deposited on a MSCS opal. To crystalize the hafnia prior to carbon removal, the sample was annealed in forming gas composed of 5% $H_2$ in Argon at 600° C. for 1 hour. The conditions were chosen in order to replicate thermal removal process time and temperature. However the forming gas employed prevented oxidization of the MSCS. After annealing, the MSCS was removed using the oxygen plasma process outlined in Example X. The resulting cross-section SEM shown in FIG. 8I is directed to the fracture surface and the cross-sectional SEM shown in FIG. 8J is directed to the FIB milled surface. These micrographs showed striking similarity to the as-deposited, oxygen plasma removed samples depicted in FIG. 8G and FIG. 8H. Since the MSCS could not be oxidized and removed at the annealing temperature, the MSCS provided a support and template for the crystallization of the hafnia and better preserved the ultra-high surface area.

The second experiment was conducted to verify the crystallization of the hafnia. X-ray diffraction (XRD) analysis was performed on the as-deposited and annealed samples prepared in Examples V, VI, VII and X. In order to analyze the hafnia material that was deposited in the pores of the MSCS rather than on the surface of the MSCS, the ALD iterations were lowered to 60 cycles in order to provide a nominal thickness of 6 nanometers. Samples were tested in the as-deposited state and after annealing in forming gas with the XRD data as set forth in FIG. 9.

Figure 9:
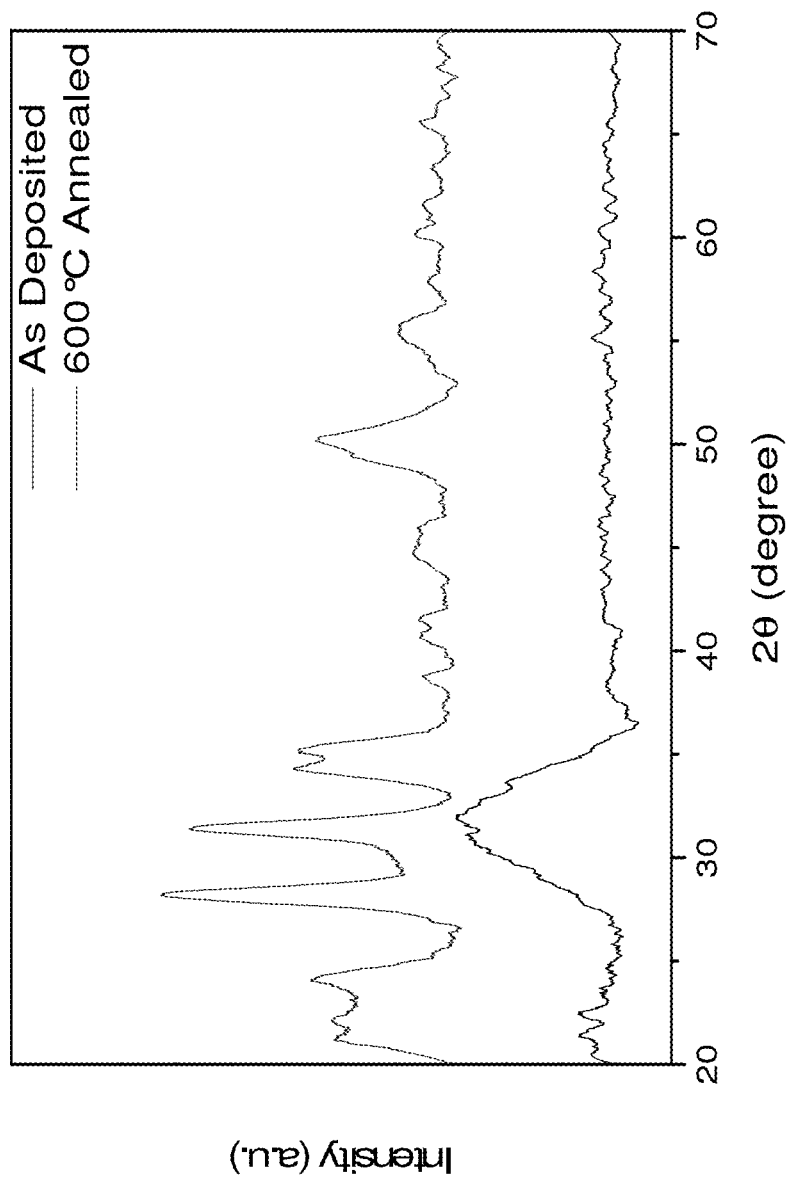
FIG. 9 is a graphic of x-ray diffraction (XRD) data of a hafnia inverse opal of the type shown in FIG. 8D and of a hafnia inverse opal of the type shown in FIG. 8I.

FIG. 9 includes a lower trace directed to XRD data for the as-deposited material. The upper trace is directed to the annealed material. FIG. 9 demonstrates that the hafnia ALD deposits amorphously and crystalizes as a result of thermal removal.

Using the Scherrer Equation, it is possible to determine the crystalline size domain $\langle d \rangle$, $$\langle d \rangle = \frac{K\lambda}{B\cos\theta} \quad (I)$$

wherein K is the shape factor, assumed to be 0.9; $\lambda$ is the $CuK_a$ wavelength, B is the FWHM after subtracting instrument broadening, and $2\theta$ is the corresponding Bragg angle in degrees, taken at 31°. From this, the crystalline size of the annealed hafnia was found to be 8.4 nm. This value was substantially larger than the 1.87 nm pore size but significantly less that the total length infiltrated into the pores (approximately 80 nm).

EXAMPLE XII

Figure 10:
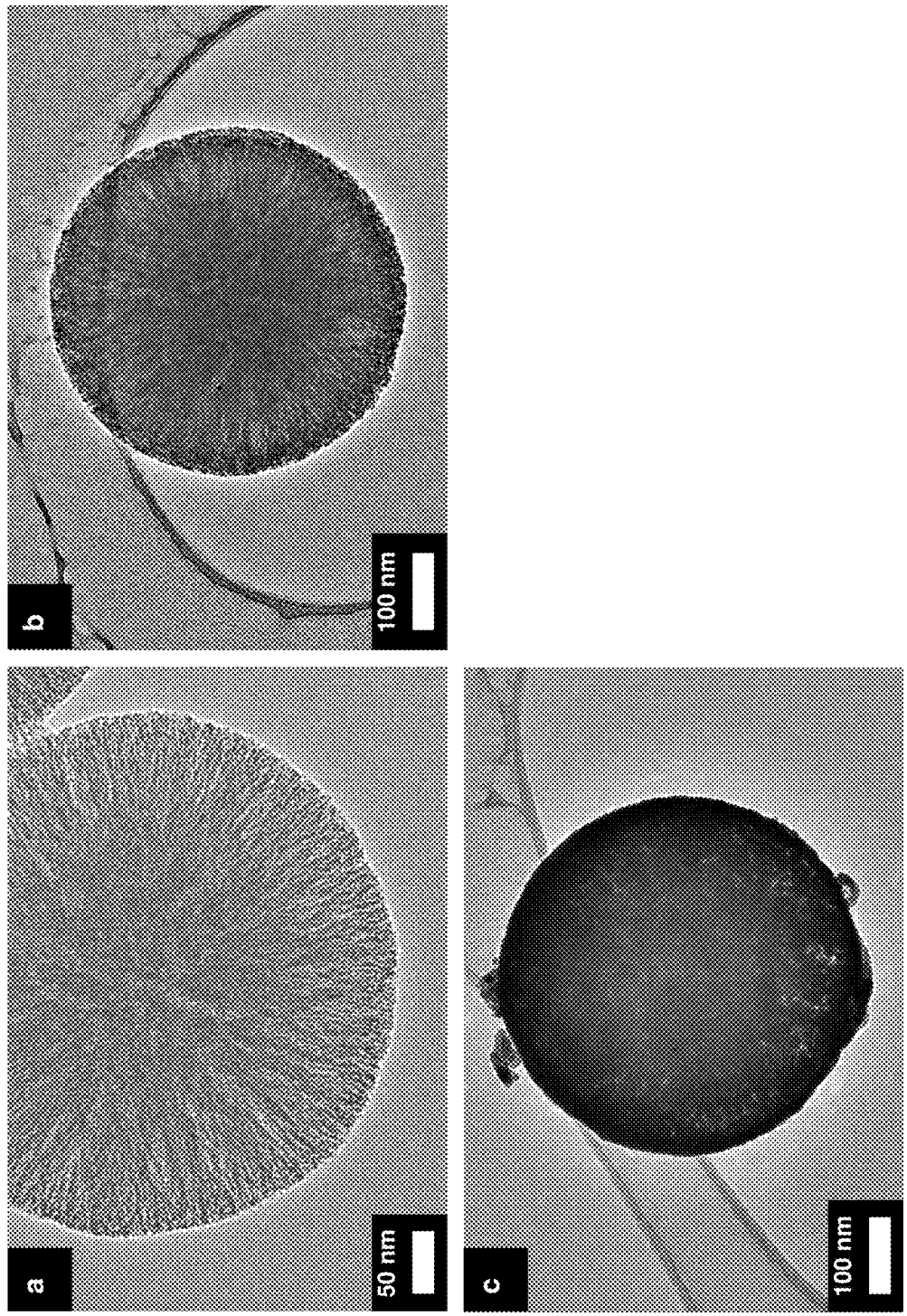
FIG. 10A is a TEM micrograph showing oxidized MSCS.
FIG. 10B is a TEM micrograph showing MSCS coated hafnia via 100 cycles of ALD.
FIG. 10C is a TEM micrograph showing a hafnia inverse structure produced by carbon removal from the hafnia coated MSCS of FIG. 10B.

An additional investigation into the hafnia infiltrating process was conducted through transmission electron microscopy (TEM). The pores of the electron-transparent, uncoated MSCS prepared according to the process outlined in Example I are illustrated in FIG. 10A. The addition of ALD hafnia according to the process outlined in Example V is illustrated in FIG. 10B. These TEMs show hafnia connects that are adjacent MSCS and infiltrating the pores due to the use of an opal template. Due to the relatively high atomic number of the hafnium in the coating, the hafnia-carbon composite is less electron-transparent.

TEM micrographs after carbon removal according to the processes outlined in Examples VI are shown in FIG. 10C in which granular hafnia structure can be seen. Through these micrographs, the hafnia ALD process can be seen to infiltrate the pores and conformally coat the MSCS.

EXAMPLE XIII

Figure 11A:
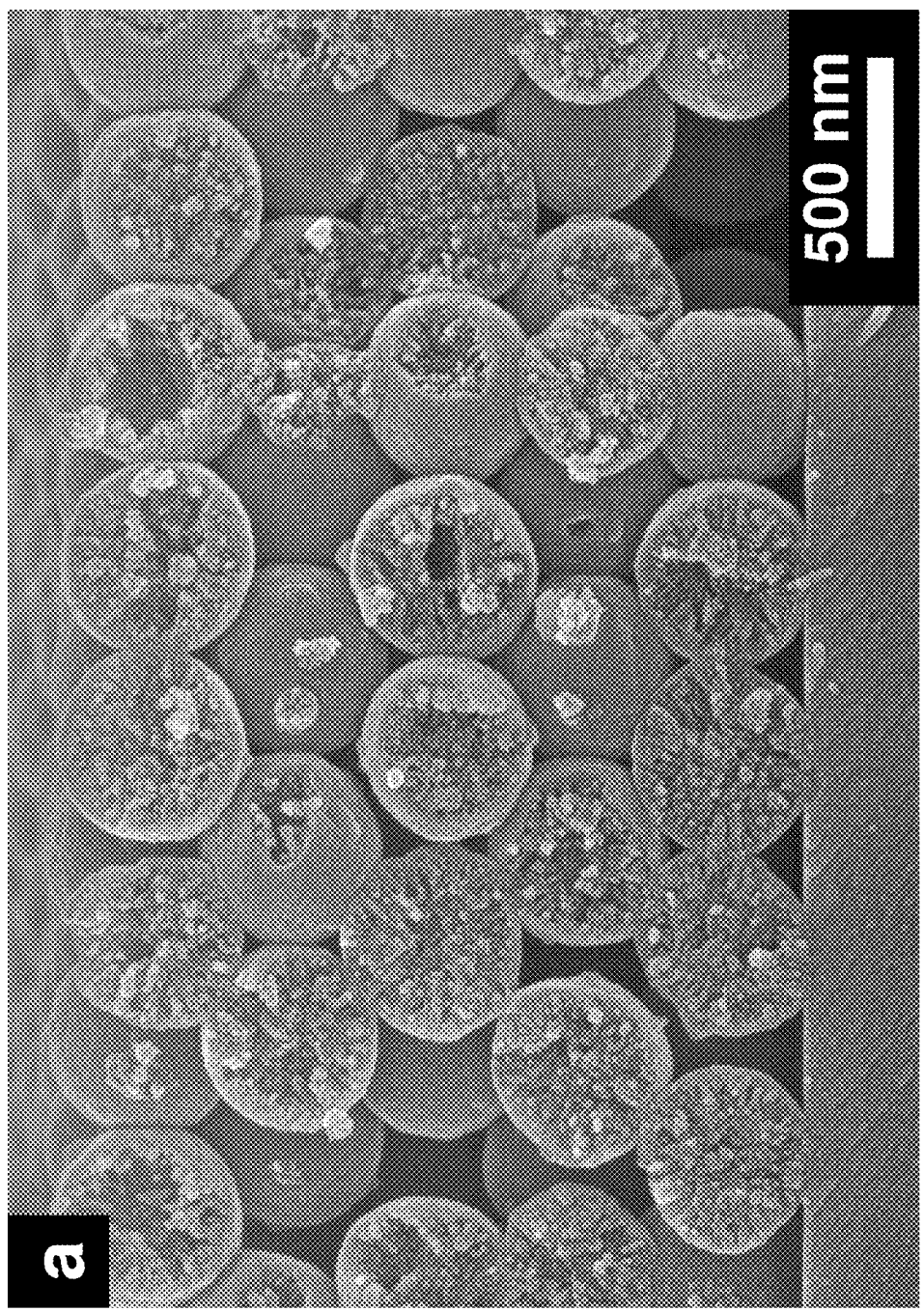
FIGS. 11A and 11B are SEM micrograph images of $Al_2O_3$ inverse opal prepared using MSCS according to an embodiment as disclosed herein.
Figure 11B:
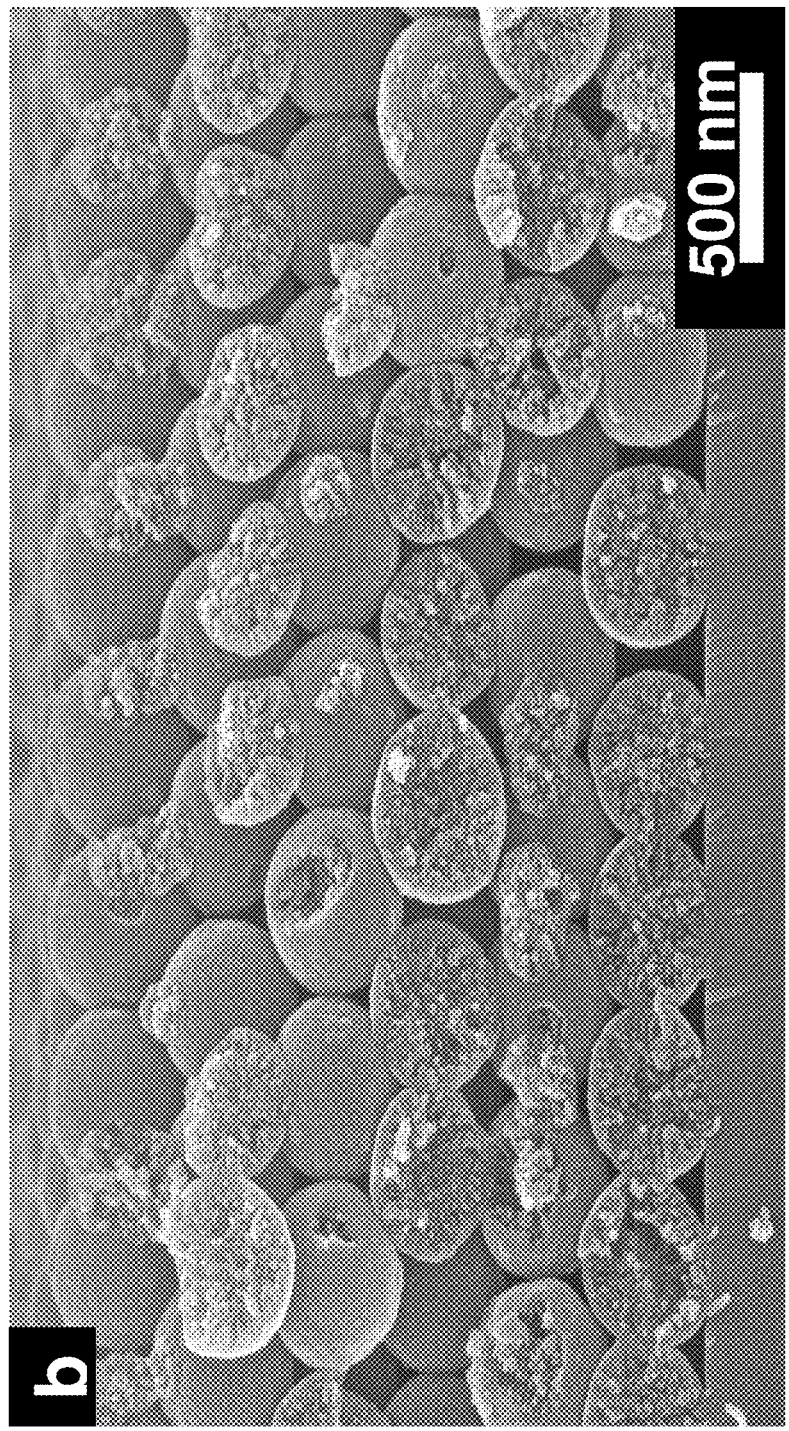

In order to demonstrate the versatility of MSCS opals as ultra-high surface templates, alumina ALD was conducted with the MSCS thermally removed using a trimethylaluminum $(AL_2(CH_3)_6)$ precursor. As with hafnia, the thermal removal process is orthogonal to alumina removal and thus preserves the MSCS features. As illustrated in FIGS. 11A and 11B, alumina infiltrated almost completely into the center of the MSCS.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A self-assembled carbon structure comprising:
   functionalized monodispersed starburst carbon spheres (MSCS) oriented in a three-dimensional colloidal crystal, wherein the MSCS have a porous surface and a zeta potential of about −46 mV, wherein the carbons spheres have an average diameter less than 3000 nm.

2. The self-assembled carbon structure of claim 1 wherein the MSCS have an average pore size between 1.0 nm and 20.0 nm.

3. The self-assembled carbon structure of claim 1 wherein the MSCS have an average pore size between 1.0 nm and 10.0 nm.

4. The self-assembled carbon structure of claim 1 wherein the MSCS have an average diameter less than 500 nm.

5. The self-assembled carbon structure of claim 2 wherein the MSCS have an average diameter between 120 nm and 1400 nm.

6. The self-assembled carbon structure of claim 1 wherein the structure comprises at least two layers of MSCS oriented in a three-dimensional periodic colloidal crystal structure.

7. The self-assembled carbon structure of claim 1 wherein the MSCS have an average pore size less than 2.5 nm.

8. The self-assembled carbon structure of claim 1 wherein the MSCS have an average pore size between 1.5 nm and 2.5 nm.

9. The self-assembled carbon structure of claim 8 wherein the pores on the MSCS are ordered in an orientation of cubic, hexagonal or mixture thereof.

10. The self-assembled carbon structure of claim 8 wherein the pores on the MSCS are present in irregular order.

11. The self-assembled carbon structure of claim 1 wherein the MSCS have an average surface area greater than 500 m$^2$/g.

12. The self-assembled carbon structure of claim 1 wherein the MSCS have an average pore size less than 2.5 nm and an average surface area that is greater than 800 m$^2$/g.

13. The self-assembled carbon structure of claim 12 wherein the average surface area is greater than 1000 m$^2$/g.

14. The self-assembled carbon structure of claim 12 further comprising a deposition material conformably deposited on the MSCS, the deposition material comprising at least one of a metal, a chalcogenide, an inorganic oxide, an inorganic nitride, and a Group II-VI compound semiconductor material.

15. The self-assembled carbon structure of claim 14 wherein each monodispersed starburst carbon sphere has an outer surface having a plurality of pores on the outer surface and wherein the deposition material comprises at least one metal or metal oxide selected from the group consisting of hafnium, aluminum, nickel, tungsten gold, silver, silicon, platinum, cobalt, chromium, titanium, molybdenum, and mixtures thereof, wherein at least a portion of the deposition product is present in the pores.

16. The self-assembled carbon structure of claim 15 wherein the MSCS have an average pore size between 1.5 and 1.9 nm and an average diameter between 200 nm and 500 nm, the deposition material projecting into the pores to a depth of at least 25% of an average sphere radius.

17. The self-assembled carbon structure of claim 15 wherein the MSCS have a pore volume between 0.20 mL/g and 1.6 mL/g.

18. A self-assembled carbon structure composed of comprising:
    monodispersed starburst carbon spheres (MSCS) oriented in a periodic colloidal crystal structure, wherein the carbon spheres have an average particle diameter less than 3000 nm, an average pore size between 1.0 nm and 10 nm, the MSCS having carbon-oxygen bonds present at a percentage of about 8% of combined carbon-oxygen and carbon-carbon bonds as determined by x-ray photoelectron spectroscopy.

19. The self-assembled carbon structure of claim 18 wherein the periodic colloidal crystal comprises at least two layers of MSCS oriented in a three-dimensional periodic structure.

20. The self-assembled carbon structure of claim 18 wherein the MSCS have an average surface area greater than 1000 m$^2$/g.

21. The self-assembled carbon structure of claim 18 wherein the MSCS have a zeta potential more negative than −15 m/V.

22. The self-assembled carbon structure of claim 18 further comprising a deposition material deposited in the pores of the MSCS, the deposition material comprising at least one of a metal, a chalcogenide, and an inorganic oxide wherein the deposition material is present at a depth of at least 25% of an average radius of the MSCS.

23. The self-assembled carbon structure of claim 22 wherein the deposition material is at least one metal or metal oxide selected from the group consisting of hafnium, aluminum, nickel, tungsten, gold, silver, silicon, platinum, cobalt, chromium, titanium, molybdenum, and mixtures thereof.

* * * * *